United States Patent
Yoshioka et al.

(10) Patent No.: US 7,030,804 B2
(45) Date of Patent: Apr. 18, 2006

(54) SWITCHED-CAPACITOR CIRCUIT AND PIPELINED A/D CONVERTER

(75) Inventors: Masato Yoshioka, Kawasaki (JP); Masahiro Kudo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/067,259

(22) Filed: Feb. 28, 2005

(65) Prior Publication Data

US 2006/0061502 A1   Mar. 23, 2006

(30) Foreign Application Priority Data

Sep. 17, 2004   (JP)   ............... 2004-271766

(51) Int. Cl.
*H03M 1/12* (2006.01)

(52) U.S. Cl. ...................................... 341/172; 341/155
(58) Field of Classification Search ................ 341/172
See application file for complete search history.

(56) References Cited

U.S. PATENT DOCUMENTS

| 5,499,027 | A | | 3/1996 | Karanicolas et al. | |
|---|---|---|---|---|---|
| 5,784,016 | A | * | 7/1998 | Nagaraj | 341/120 |
| 6,040,793 | A | * | 3/2000 | Ferguson et al. | 341/143 |
| 6,433,724 | B1 | * | 8/2002 | Confalonieri et al. | 341/155 |
| 6,433,727 | B1 | * | 8/2002 | Yoshinaga | 341/172 |
| 6,473,018 | B1 | * | 10/2002 | Ueno et al. | 341/143 |
| 6,486,820 | B1 | | 11/2002 | Allworth et al. | |
| 6,686,865 | B1 | * | 2/2004 | Confalonieri et al. | 341/172 |
| 6,747,589 | B1 | * | 6/2004 | Srinivasan et al. | 341/172 |
| 6,784,824 | B1 | * | 8/2004 | Quinn | 341/172 |

FOREIGN PATENT DOCUMENTS

| EP | 0 899 884 A | 3/1999 |
|---|---|---|
| JP | 05-055048 | 3/1993 |
| JP | 2000-013189 | 1/2000 |

\* cited by examiner

*Primary Examiner*—Linh V. Nguyen
(74) *Attorney, Agent, or Firm*—Arent Fox PLLC

(57) ABSTRACT

An input capacitor and a plurality of reference capacitors sample an input voltage and reference voltages in a first period. A switch circuit connects the input capacitor and one of the reference capacitors between an output and an input of an amplifier in a second period. This mechanism causes a feedback gain to be "1" in the second period. Therefore, it is possible to reduce power consumption and noise.

16 Claims, 34 Drawing Sheets

US 7,030,804 B2

SWITCHED-CAPACITOR CIRCUIT AND PIPELINED A/D CONVERTER

CROSS-REFERENCE TO RELATED APPLICATIONS

This application is based upon and claims the benefit of priority from Japanese Patent Application No. 2004-271766, filed on Sep. 17, 2004, the entire contents of which are incorporated herein by reference.

BACKGROUND OF THE INVENTION

1. Field of the Invention

The present invention relates to a switched-capacitor circuit and a pipelined A/D converter configured by using the switched-capacitor circuit.

2. Description of the Related Art

A pipelined A/D converter is well-known as a high-speed A/D converter with high resolution.

Further, a switched-capacitor circuit is in wide use in order to enable the pipelined A/D converter to perform a series of signal processing with a simple circuit and with high accuracy. An example of the switched-capacitor circuit of this kind is disclosed in Japanese Unexamined Patent Application Publication No. 2000-13189.

In conventional switched-capacitor circuits disclosed in the aforesaid patent document and so on, a feedback gain from an output to an input of an amplifier is as small as ½. Therefore, there has been a problem that power consumption of the amplifier becomes relatively large. There has been a problem that reducing power consumption results in a relatively low operating speed of the circuit. There has been another problem of a poor signal-to-noise ratio (SNR) since equivalent input noise of the amplifier is amplified twofold.

SUMMARY OF THE INVENTION

It is an object of the present invention to lower power consumption of a switched-capacitor circuit and a pipelined A/D converter using the switched-capacitor circuit and to increase operating speed thereof.

According to a first aspect of the present invention, a switched-capacitor circuit includes an input capacitor, first to $n^{th}$ reference capacitors, an amplifier, and a switch circuit. The input capacitor and the first to $n^{th}$ reference capacitors sample an input voltage and first to $n^{th}$ reference voltages, respectively, in a first period. That is, electric charges corresponding to the voltages are accumulated in the capacitors respectively. In a second period subsequent to the first period, the switch circuit connects the input capacitor between an output and an input of the amplifier and connects at least one of the first to $n^{th}$ reference capacitors between the output and the input of the amplifier according to a control signal.

The amplifier generates an output voltage corresponding to the input voltage according to the electric charge of the capacitor connected to the amplifier. The input capacitor and the reference capacitor are both connected between the input and the output of the amplifier in a holding period, so that a feedback gain is "1". As a result, when the operating speed is made equal to conventional one, it is possible to reduce power consumption of the switched-capacitor circuit (amplifier). When power consumption is made equal to conventional one, it is possible to improve the operating speed of the switched-capacitor circuit. In addition, the larger feedback gain reduces equivalent input noise of the amplifier, resulting in improving a SNR.

According to a second aspect of the present invention, a pipelined A/D converter has a plurality of stages connected in cascade. At least one of the stages has the same switched-capacitor circuit as that of the first aspect described above. Therefore, it is possible to configure a pipelined A/D converter with small power consumption. Or, it is possible to configure a pipelined A/D converter with a high operating speed. Further, it is possible to configure a high-accuracy pipelined A/D converter with a high SNR.

In a preferable example of the foregoing aspects of the present invention, an input switch of the switch circuit connects both ends of the input capacitor to a node of the input voltage and a node of a fixed voltage in the first period and to the input and the output of the amplifier in the second period. A reference switch of the switch circuit connects both ends of each of the reference capacitors to a node of each of the reference voltages and a node of the fixed voltage in the first period and to the input and the output of the amplifier according to the control signal in the second period. In this manner, it is possible to configure a switched-capacitor circuit having the aforesaid features with simple switches and without any increase in circuit scale.

In a preferable example of the foregoing aspects of the present invention, an input switch of the switch circuit connects one end of the input capacitor to a node of the input voltage in the first period and to the output of the amplifier in the second period. A reference switch of the switch circuit connects both ends of each of the reference capacitors to a node of each of the reference voltages and the input of the amplifier in the first period and to the input and the output of the amplifier according to the control signal in the second period. A short switch shorts the output and the input of the amplifier to each other in the first period. An offset value of the amplifier can be cancelled by the short switch.

In a preferable example of the foregoing aspects of the present invention, the amplifier is a differential amplifier having complementary inputs and complementary outputs. The input capacitor and the reference capacitors are formed for each pair of the input and the output of the amplifier. In a switched-capacitor circuit of a complete differential type, the aforesaid features can also be easily realized.

In a preferable example of the aforesaid aspects of the present invention, each of the first to $n^{th}$ reference capacitors is constituted of a plurality of sub-capacitors arranged in parallel. The switch circuit connects at least two of the sub-capacitors between the output and the input of the amplifier according to the control signal in the second period. In this invention, depending on the kind and the number of the sub-capacitors connected to the amplifier in the second period, a large variety of voltages can be generated. Therefore, it is possible to lessen the kinds of reference voltages to be supplied to the switched-capacitor circuit. In other words, it is possible to eliminate a need for several circuits generating the respective reference voltages. As a result, it is possible to reduce circuit scale of a system on which the switched-capacitor circuit is mounted.

In a preferable example of the foregoing aspects of the present invention, a comparing circuit compares magnitudes of the input voltage and a comparison voltage to output a comparison result as the control signal in a third period set between the first period and the second period. This means that the comparing circuit functions as an A/D converter that receives the input voltage to output the control signal indicating the magnitude thereof. Therefore, for example, when the switched-capacitor circuit is applied to a pipelined A/D converter, it can also function as a sub A/D converter. As a result, it is possible to simply configure the pipelined A/D converter.

In a preferable example of the foregoing aspects of the present invention, the comparing circuit includes a comparison capacitor, a comparator, and a comparing switch. The comparator is connected to one end of the comparison capacitor at an input thereof and outputs the control signal from an output thereof. The comparing switch connects both ends of the comparison capacitor to a node of the input voltage and a node of the fixed voltage in the first period and to a node of the comparison voltage and the input of the comparator in the third period. This means that the comparison capacitor and the comparing switch function as a sampling and holding circuit holding the input voltage. Therefore, for example, when the switched-capacitor circuit is applied to a first stage of a pipelined A/D converter, the switched-capacitor circuit of the present invention can replace a conventional input front-end circuit including a sampling and holding circuit. Generally, in a pipelined A/D converter, an input front-end circuit is a circuit having the greatest influence on performance (conversion accuracy) of the A/D converter. A sampling and holding circuit in the input front-end circuit is formed by using a circuit with large power consumption such as an amplifier in order to transmit a sampled input voltage to a subsequent stage with high accuracy. Applying the present invention makes it possible to configure a high-accuracy sampling and holding circuit with a simple circuitry. In other words, it is possible to configure a front-end circuit with small power consumption and with a small circuit area.

In a preferable example of the second aspect of the present invention, each sub A/D converter A/D converts a voltage outputted from a preceding stage to output a bit value. An encoding unit encodes the bit values outputted from the respective stages to output a digital value consisting of a plurality of bits. The sub A/D converters convert the analog voltage to the bit values in sequence, so that the pipeline operation is executed.

In a preferable example of the second aspect of the present invention, a switch control circuit of the pipelined A/D converter generates the control signal for turning off/on the switch circuit, according to a bit value outputted by a sub A/D converter connected to an input of the switched-capacitor circuit. Therefore, the control signal can be easily generated by using an output of the sub A/D converter.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described using the drawings. In the description below, signal lines and nodes through which signals are transmitted are designated by the same reference symbols as those of signal names. A pipelined A/D converter 100 shown below is applied to, for example, an analog front-end chip of a digital home electric appliance such as a digital television and a liquid crystal projector. The analog front-end chip is formed, for example, on a silicon substrate by mainly using a CMOS process.

FIG. 1 to FIG. 8 show a first embodiment of the switched-capacitor circuit and the pipelined A/D converter of the present invention.

Figure 1:
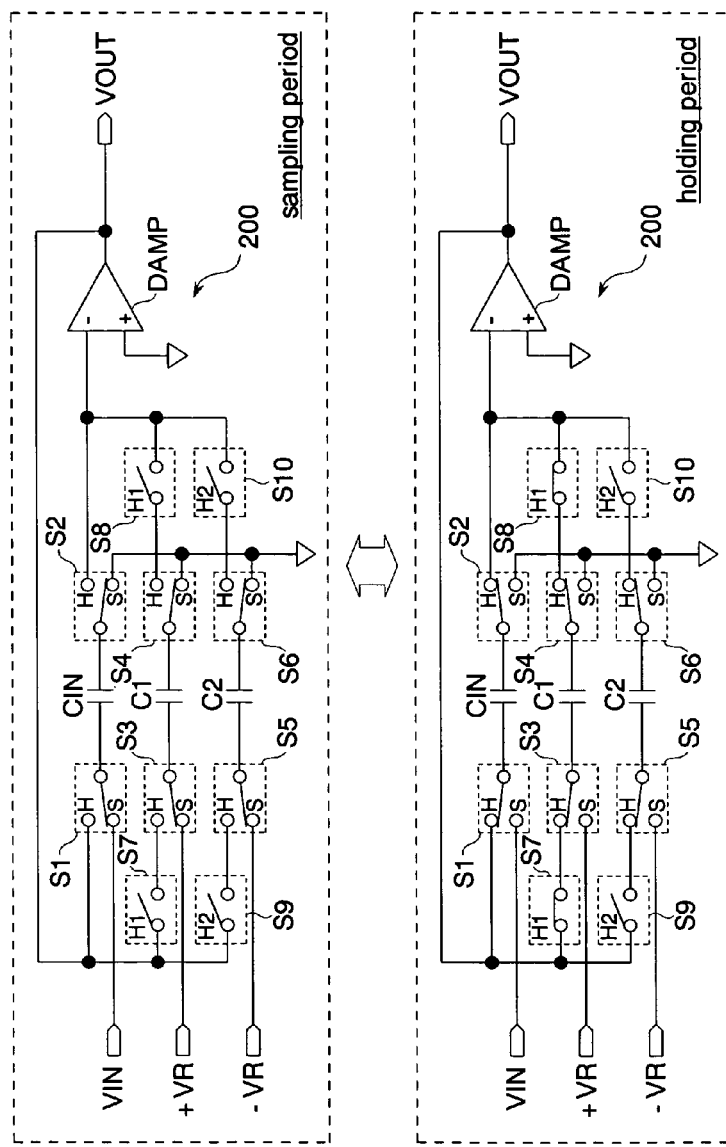
FIG. 1 is a circuit diagram showing details of a switched-capacitor circuit of a first embodiment of the present invention.

FIG. 1 shows details of a switched-capacitor circuit 200. Here, an input voltage VIN and an output voltage VOUT represent an input voltage and an output voltage of the switched-capacitor circuit 200. The switched-capacitor circuit 200 has an input capacitor CIN, a first and a second reference capacitor C1, C2, a switch circuit constituted of switches S1 to S10, and a differential amplifier DAMP. Capacitances of the capacitors CIN, C1, C2 are set to be equal to one another. Each of the switches S1 to S10 is constituted of an nMOS transistor, a pMOS transistor, or a CMOS transmission gate that turns on/off according to a gate voltage. "S" and "H" of the switches S1 to S6 represent switched-on sides when a high-level sampling signal S and a high-level holding signal H are received. "H1" of the switches S7, S8 represents that they turn on when receiving a high-level control signal H1. "H2" of the switches S9, S10 represents that they turn on when receiving a high-level control signal H2.

One end and the other end of the capacitor CIN are connected to an output VOUT and a "−input" of the differential amplifier DAMP via nodes H of the input switches S1, S2 respectively, and connected to an input voltage line VIN and a ground voltage line (fixed voltage) via nodes S of the switches S1, S2 respectively. The capacitor C1 is connected to the output VOUT and the "−Input" of the differential amplifier DAMP via nodes H of the reference switches S3, S4 and via the reference switches S7, S8 respectively, and is connected to a first reference voltage line +VR and the ground voltage line via nodes S of the switches S3, S4.

Similarly, the capacitor C2 is connected to the output VOUT and the "−input" of the differential amplifier DAMP via nodes H of the reference switches S5, S6 and via the reference switches S9, S10, respectively, and is connected to a second reference voltage line −VR and the ground voltage line via nodes S of the switches S5, S6, respectively. A "+input" of the differential amplifier DAMP is connected to the ground voltage line.

In the switched-capacitor circuit 200 described above, in a sampling period (first period), one-side ends of the capacitors CIN, C1, C2 are connected to the input voltage line VIN and the reference voltage lines +VR, −VR respectively, and the other ends thereof are connected to the ground voltage line. An input voltage VIN and reference voltages +VR, −VR are sampled by the capacitors CIN, C1, C2 respectively. The capacitor CIN that has sampled the input voltage VIN is connected between the input/output of the differential amplifier DAMP in a holding period (second period) subsequent to the sampling period. At the same time, one of the control signals H1, H2 changes to high level, and one of the capacitor C1 that has sampled the reference voltage +VR and the capacitor C2 that has sampled the reference voltage −VR is connected between the input/output of the differential amplifier DAMP. The drawing shows an example where the control signal H1 changes to high level. In the holding period, a subtracter SUB and an amplifier AMP shown in FIG. 2 concurrently operate in parallel so that the holding operation is executed and an output voltage VOUT is generated.

Figure 2:
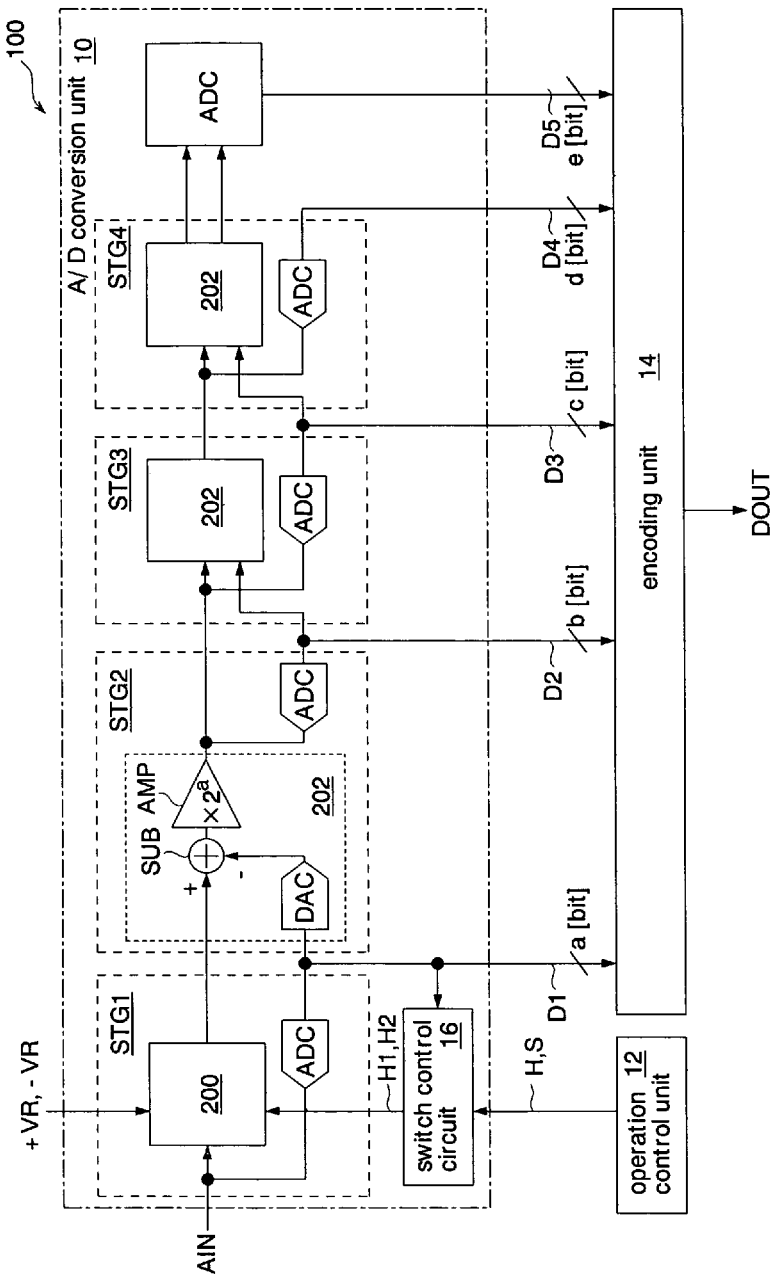
FIG. 2 is a block diagram showing a pipelined A/D converter of the first embodiment of the present invention.

FIG. 2 shows the pipelined A/D converter 100 in which the switched-capacitor circuit 200 shown in FIG. 1 is applied to an input front-end circuit (STG1). The pipelined A/D converter 100 has an A/D conversion unit 10, an operation control unit 12, and an encoding unit 14. The pipelined A/D converter 100 operates in synchronization with a clock, but the clock is not shown.

The A/D conversion unit 10 has a plurality of stages STG1 to STG4 connected in cascade, a sub A/D converter ADC converting an output voltage of the stage STG4 to a digital value D5, and a switch control circuit 16 corresponding to the stage STG1. The stage STG1 on the first stage has the switched-capacitor circuit 200 receiving an input voltage AIN (an analog voltage to be converted to a digital signal) and a sub A/D converter ADC converting the analog voltage AIN to a digital value. The sub A/D converter ADC of the stage STG1 converts the analog voltage AIN to, for example, a 1-bit digital value D1 (a=1 bit). The digital value D1 is supplied to a switched-capacitor gain stage 202 of the stage STG2 and the encoding unit 14. Each of the stages STG2 to STG4 has a known switched-capacitor gain stage 202 and a sub A/D converter ADC converting an output voltage of the switched-capacitor gain stage 202 to a digital value. The switched-capacitor gain stage 202 has a sub D/A converter DAC, a subtracter SUB, and an amplifier AMP.

The switched-capacitor circuit 200 functions also as a sampling and holding circuit of the input front-end circuit. Generally, a sampling and holding circuit of an input front-end circuit has a built-in high-accuracy amplifier in order to linearly sample all the range of an analog input and to transmit a sampled signal to a subsequent stage with high accuracy. Therefore, power consumption of the sampling and holding circuit is relatively large. In the present invention, power consumption can be lowered and noise can be reduced owing to the use of the switched-capacitor circuit 200 as the first-stage sampling and holding circuit, as will be described later.

The sub D/A converter DAC of the switched-capacitor gain stage 202 of the stage STG2 converts a digital value outputted from the sub A/D converter ADC of the preceding stage STG1 to an analog voltage. The subtracter SUB subtracts the analog voltage, which is outputted by the sub D/A converter DAC, from an analog voltage outputted from the preceding STG1 to output the resultant analog voltage to the amplifier AMP. The amplifier AMP multiplies the analog voltage, which is outputted from the subtracter SUB, by 2 to the $b^{th}$ power and outputs the resultant to the sub A/D converter ADC on the same stage and a subtracter SUB of the subsequent stage STG3. Here, the constant b is equal to the number of bits b of a digital value D2 outputted by the stage STG2. The amplifiers AMP (not shown) of the switched-capacitor gain stages 202 of the stages STG3, STG4 multiply analog voltages outputted from subtracters SUB by 2 to the $b^{th}$ power and by 2 to the $c^{th}$ power respectively.

In this example, the constants b, c, d are all 1 bit. That is, each of the amplifiers AMP generates an output voltage that is twice as high as a received voltage value. Note, the constants a, e are also 1 bit.

The switch control circuit 16 generates the control signals H1, H2 for controlling the switches S1 to S10 included in the switched-capacitor circuit 200 described in FIG. 1, according to the digital value outputted from the sub A/D converter ADC of the stage STG1.

The control signals H1, H2 are generated in synchronization with a high-level period of a holding signal H. The operation control unit 12 alternately generates a high-level sampling signal S and a high-level holding signal H determining the sampling period and the holding period of the switched-capacitor circuit 200, at a predetermined cycle. The encoding unit 14 encodes the digital values D1 to D5 that are sequentially generated by the stages STG1 to STG4 of the A/D conversion unit 10 and the sub A/D converter ADC on the final stage, and outputs a digital signal DOUT of, for example, 5 bits. That is, the pipelined A/D converter 100 converts the analog signal AIN to the 5-bit digital signal DOUT. Here, the digital value D1 is the most significant bit and the digital value D5 is the least significant bit.

Figure 3:
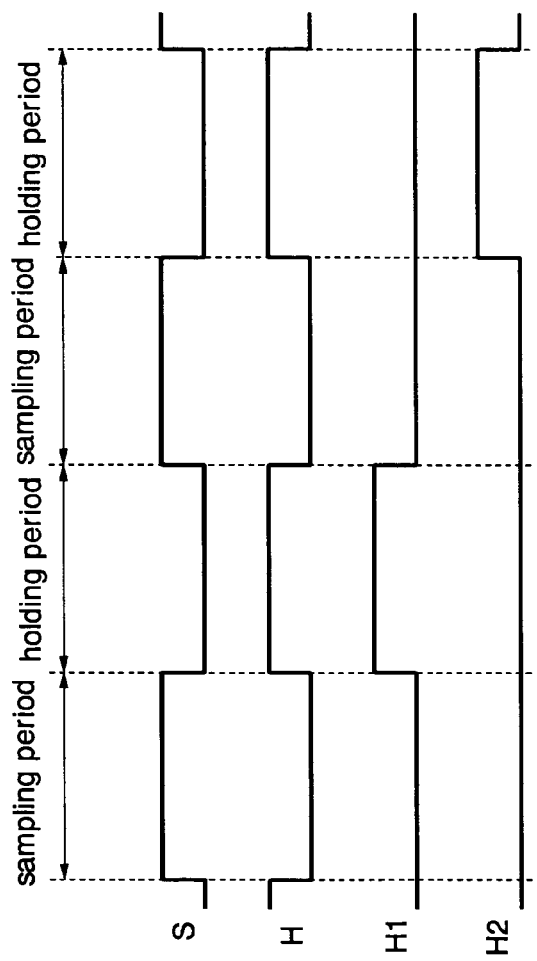
FIG. 3 is a timing chart showing operations of the switched-capacitor circuit shown in FIG. 1.

FIG. 3 shows operations of the switched-capacitor circuit 200 shown in FIG. 1. The switched-capacitor circuit 200 executes a sampling operation and a holding operation in the sampling period and the holding period which are alternately changed over in synchronization with transition edges of a clock CLK, respectively. The sampling period is a high-level period of the sampling signal S, and the holding period is a high-level period of the holding signal H. The sampling signal S and the holding signal H are complementary signals whose high-level periods do not coincide with each other. In the holding period, one of the control signals H1, H2 is kept at high level and the aforesaid holding operation is executed. The drawing shows an example where the control signal H1 is changed to high level when the first holding period comes and the control signal H2 is changed to high level when the subsequent holding period comes.

Figure 4:
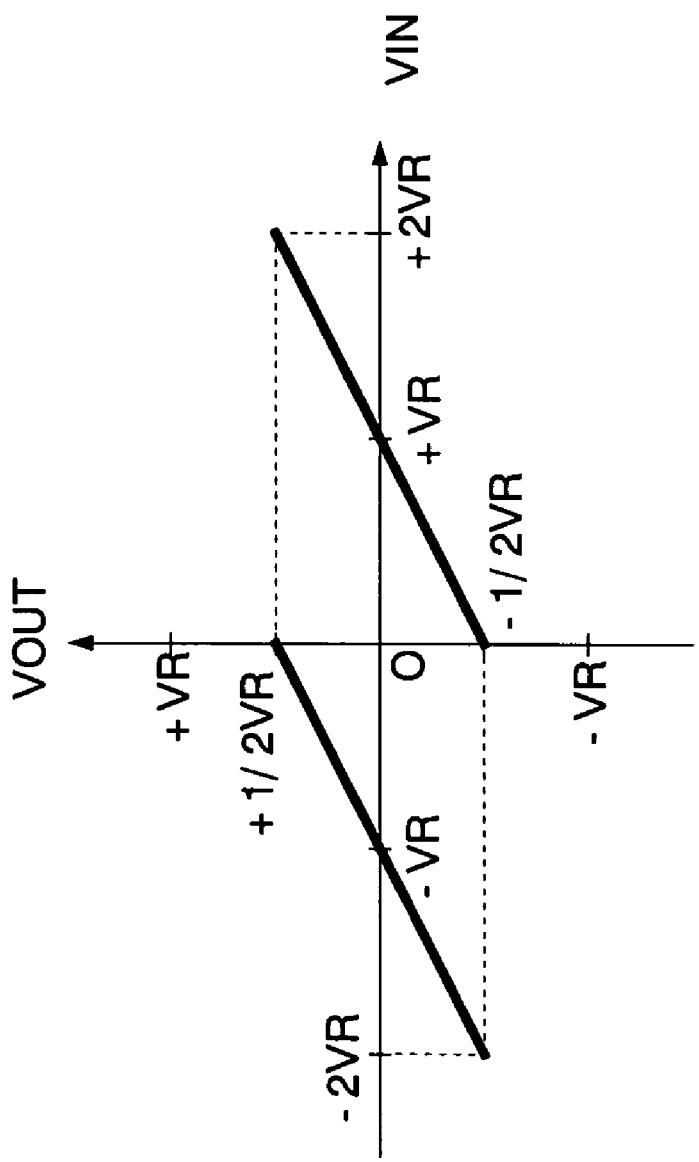
FIG. 4 is a characteristic chart showing an output voltage generated by a holding operation of the switched-capacitor circuit shown in FIG. 1.

FIG. 4 shows the output voltage VOUT generated by the holding operation of the switched-capacitor circuit 200 shown in FIG. 1. The output voltage VOUT is generated according to expressions (1), (2).

$$\tfrac{1}{2} \times (VIN-VR) \ (at\ VIN \geq 0) \tag{1}$$

$$\tfrac{1}{2} \times (VIN+VR) \ (at\ VIN < 0) \tag{2}$$

Figure 5:
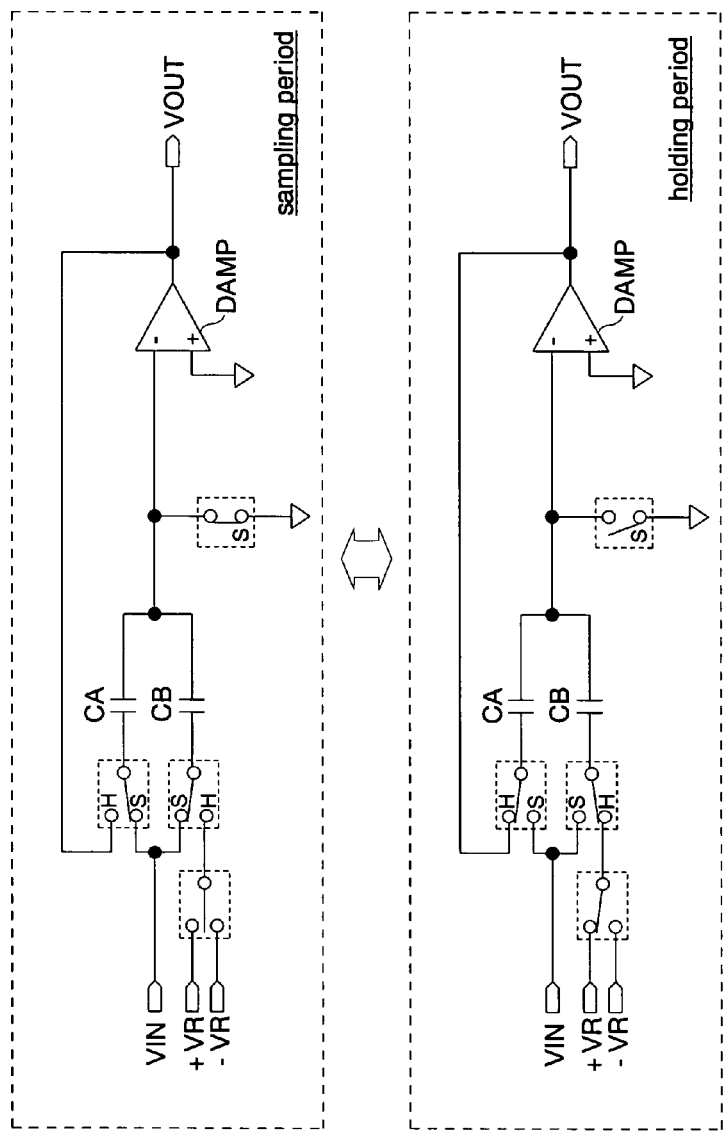
FIG. 5 is a circuit diagram showing a switched-capacitor circuit considered by the inventors of the present invention before the present invention was made.

FIG. 5 shows a switched-capacitor circuit considered by the inventors of the present invention before the present invention was made. This switched-capacitor circuit has: two capacitors CA, CB sampling an input voltage VIN in a sampling period; and a switch group that connects the capacitor CA to an input voltage line VIN, a ground voltage line, and a differential amplifier DAMP and connects the capacitor CB to the input voltage line VIN, reference voltage lines +VR, −VR, and the ground voltage line. "S" and "H" of each switch represent switched-on sides in the sampling period and a holding period.

Figure 6:
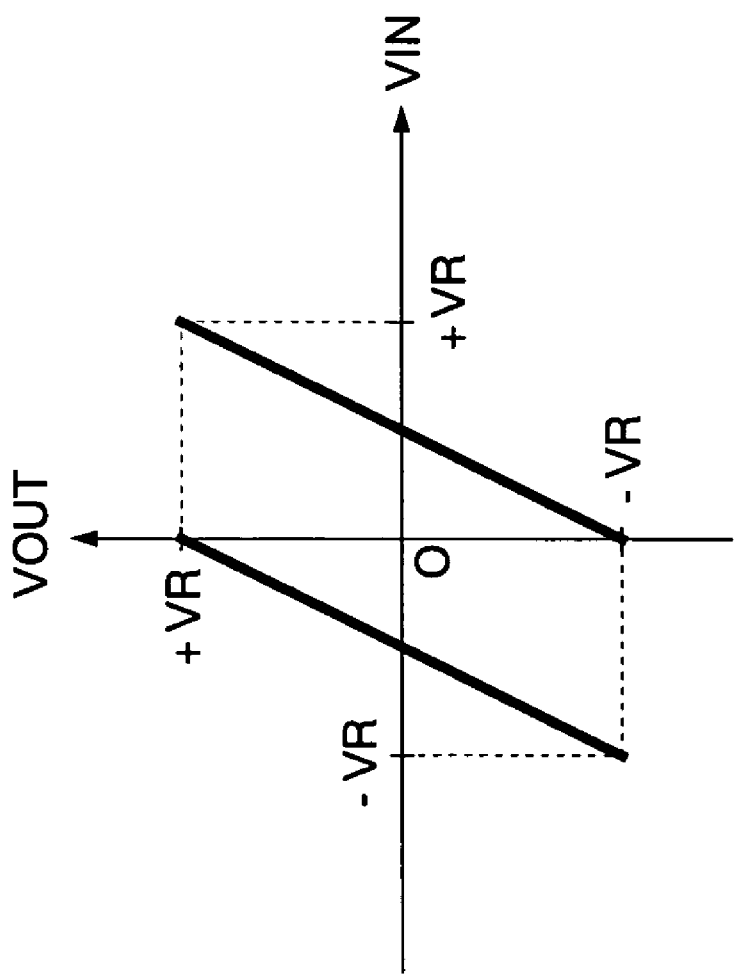
FIG. 6 is a characteristic chart showing an output voltage generated by a holding operation of the switched-capacitor circuit shown in FIG. 5.

FIG. 6 shows an output voltage VOUT generated by a holding operation of the switched-capacitor circuit shown in FIG. 5. The output voltage VOUT is generated according to expressions (3), (4).

$$2VIN-VR \ (at\ VIN \geq 0) \tag{3}$$

$$2(VIN+VR) \ (at\ VIN < 0) \tag{4}$$

When an input voltage VIN is 4×VIN, a reference voltage VR is 2×VR, and a reference voltage −VR is 2×(−VR) in the above expressions (1), (2) representing characteristics of the switched-capacitor circuit 200 of the present invention, the expressions (1), (2) are equal to the expressions (3), (4). Therefore, if twofold reference voltages VR, −VR are supplied and the input voltage is quadrupled at the input of the stage STG1 in the pipelined A/D converter 100 shown in FIG. 2, it is possible to configure a pipelined A/D converter having the same characteristics as those of a pipelined A/D converter configured by using the switched-capacitor circuit shown in FIG. 5.

Figure 7:
FIG. 7 is an explanatory chart showing characteristics of the switched-capacitor circuit of the present invention.

FIG. 7 shows the characteristics of the switched-capacitor circuit of the present invention. gm represents mutual conductance. An output voltage Vn2(out) of the differential amplifier DAMP is not divided in the capacitors CIN, C1 but becomes an input voltage Vn2(in) of the differential amplifier DAMP as it is via the capacitors CIN, C1. On the other hand, in the switched-capacitor circuit shown in FIG. 5, an output voltage Vn1(out) of a differential amplifier DAMP is divided in the capacitors CA, CB, so that an input voltage Vn1(in) becomes lower than the output voltage Vn1(out) (an amplification factor is two times). Therefore a feedback gain β of the switched-capacitor circuit 200 is double a feedback gain β of the switched-capacitor circuit shown in FIG. 4.

Further, the capacitors C1, C2 are not recognized as loads on the differential amplifier DAMP. Therefore, a GBW product (Gain BandWidth product) in the holding operation of the switched-capacitor circuit 200 is equal to or larger than double a GBW product of the switched-capacitor circuit shown in FIG. 4. Therefore, when the switched-capacitor circuit 200 and the pipelined A/D converter 100 are designed to have the same operating speed as conventional one, power consumption can be reduced to half or lower. When they are designed to have about the same power consumption as conventional one, the operating speed (conversion speed) can be greatly improved. Moreover, equivalent input noise of the switched-capacitor circuit 200 and the differential amplifier DAMP are halved compared with that of the switched-capacitor circuit shown in FIG. 5 because of the same reason for the feedback gain β. Since a SNR can be improved, a high-accuracy pipelined A/D converter can be configured.

Figure 8:
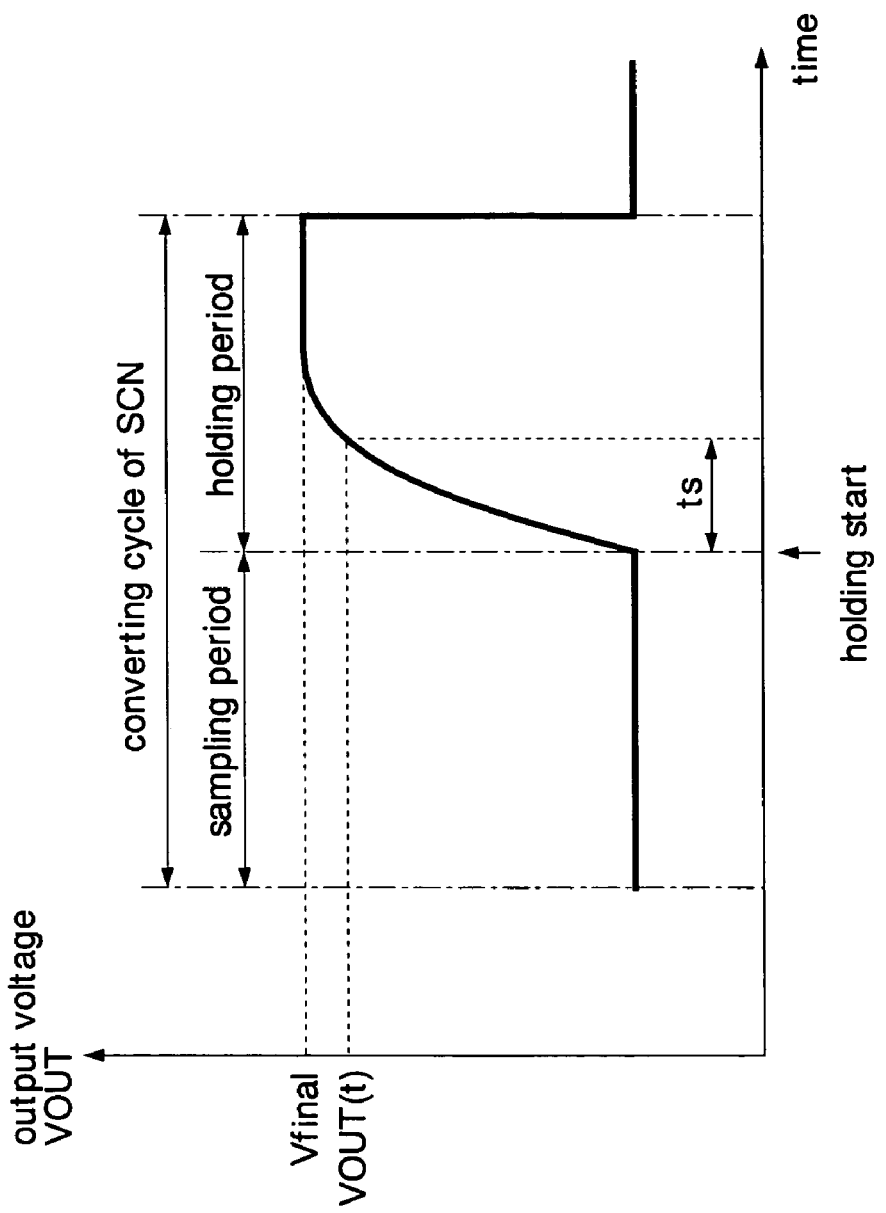
FIG. 8 is an explanatory chart showing operations of the switched-capacitor circuit in the first embodiment of the present invention.

FIG. 8 shows a change of the output voltage VOUT when the switched-capacitor circuit 200 is in operation. The output voltage VOUT in the holding period is settled to reach a final value Vfinal. At this time, in order to increase accuracy of the output voltage, it is important to settle the output voltage VOUT to a voltage with a desired accuracy relative to the final value Vfinal. In particular, in a pipelined A/D converter, a switched-capacitor circuit closer to a first-stage analog input requires higher-accuracy settling.

Assuming that the switched-capacitor circuit 200 in the holding period has a linear transmission characteristic, an output voltage VOUT(t) is represented by an expression (5). Here, GBW represents a GBW product (GBWsc in FIG. 7) in the holding period of the switched-capacitor circuit 200.

$$VOUT(t) = Vfinal \times (1 - e^{-GBW \cdot t}) \tag{5}$$

A time ts required for the settling of n bits of the output voltage VOUT in the holding period is represented by an expression (6). Assuming that an occupying ratio of the time ts in a converting cycle (=a reciprocal of the conversion speed) of the entire switched-capacitor circuit 200 is α, an expression (7) gives the maximum value for a conversion speed fs of the switched-capacitor circuit 200 in which the settling of n bits is required. Here, in many cases, α=0.5. From the expression (7), the conversion speed of the switched-capacitor circuit 200 is proportional to the GBW product, and therefore, the larger the GBW product is, the higher the conversion speed can be.

$$ts=(n/GBW)\times \ln 2 \tag{6}$$

$$fs=\alpha/ts=(\alpha \times GBW)/(n\times \ln 2) \tag{7}$$

In the first embodiment described above, as shown in FIG. 7, it is possible to make the feedback gain of the differential amplifier DAMP small, so that the GBW product can be made large. The equivalent input noise of the differential amplifier DAMP can be made small. Therefore, power consumption of the differential amplifier DAMP can be reduced. When power consumption is made equal to conventional one, the operating speed of the differential amplifier DAMP can be improved. As a result, when the operating speed is made equal to conventional one, power consumption of the switched-capacitor circuit 200 can be reduced to half or lower. When power consumption is made equal to conventional one, the operating speed of the switched-capacitor 200 can be greatly improved. Moreover, since the feedback gain of the amplifier can be made small, the equivalent input noise of the amplifier can be reduced to improve a SNR. The use of the switched-capacitor circuit 200 makes it possible to configure the pipelined A/D converter 100 with low power consumption. Or, it is possible to configure the pipelined A/D converter 100 with a high operating speed. In addition, it is possible to configure the high-accuracy pipelined A/D converter 100 with a high SNR. The switched-capacitor circuit 200 can be constituted of the capacitors CIN, C1, C2 and the simple switches S1 to S10 as shown in FIG. 1, so that it is possible to configure the switched-capacitor circuit 200 and the pipelined A/D converter 100 without any increase in circuit scale.

Figure 9:
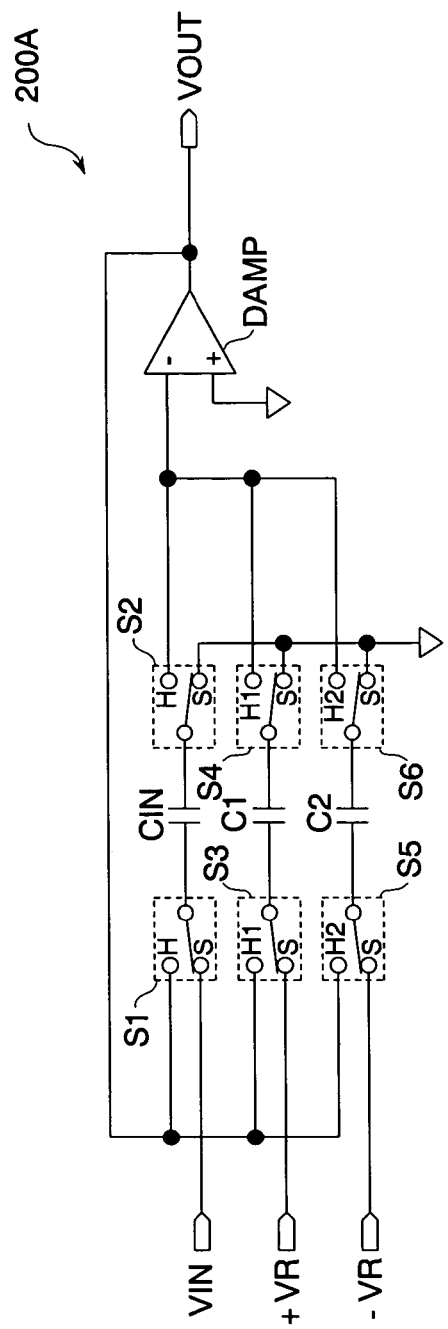
FIG. 9 is a circuit diagram showing details of a switched-capacitor circuit of a second embodiment of the present invention.
Figure 10:
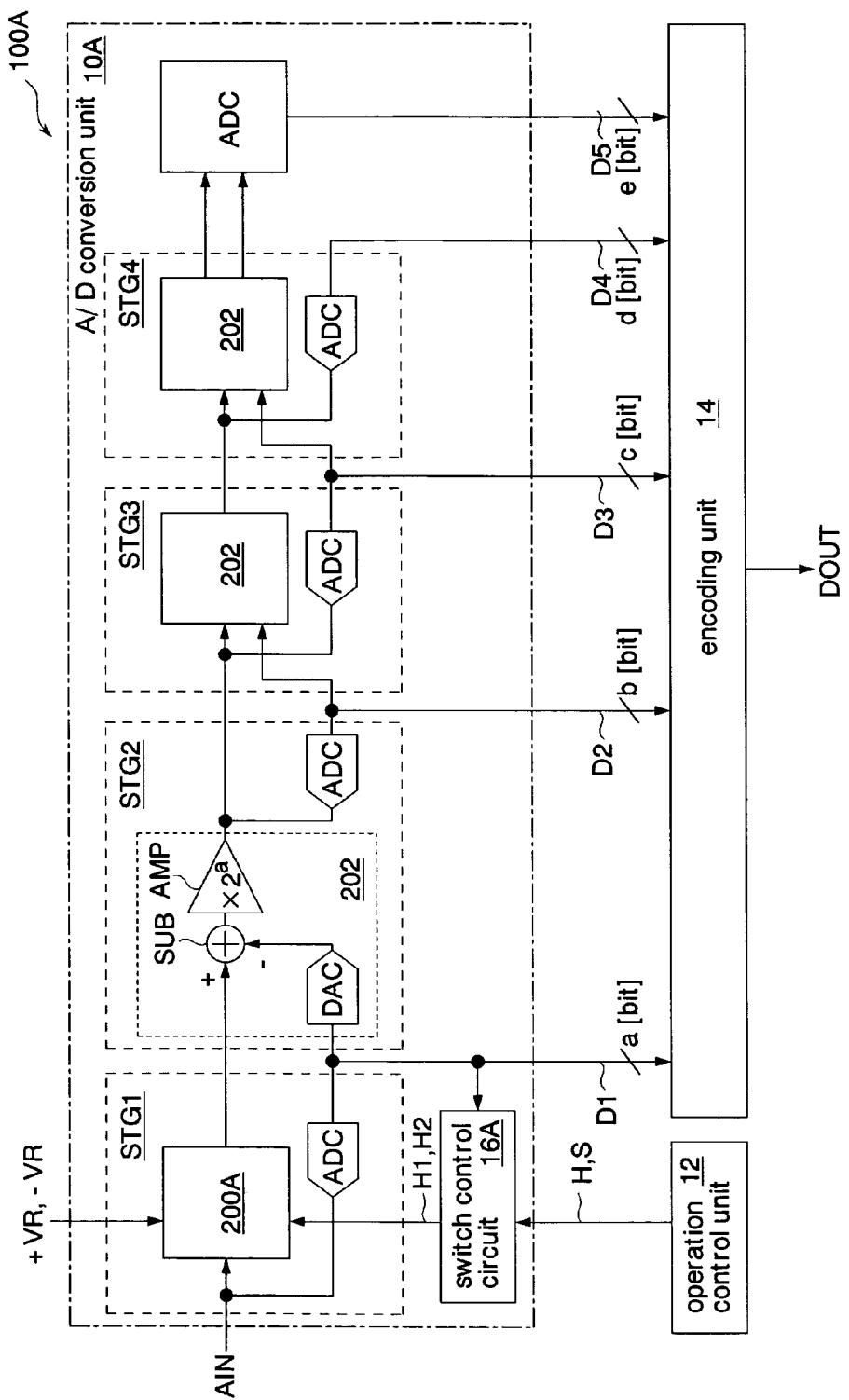
FIG. 10 is a block diagram showing a pipelined A/D converter of the second embodiment of the present invention.

FIG. 9 and FIG. 10 show a second embodiment of the switched-capacitor circuit and the pipelined A/D converter of the present invention. The same reference numerals or symbols are used to designate the same elements as the elements described in the first embodiment, and detailed description thereof will be omitted.

FIG. 9 shows details of a switched-capacitor circuit 200A. The switched-capacitor circuit 200A is configured such that the switches S7 to S10 are deleted from the switched-capacitor circuit 200. The connection relation of an input capacitor CIN and switches S1, S2 is the same as that in the first embodiment. A reference capacitor C1 is connected to an output VOUT and a "−input" of a differential amplifier DAMP via "H1 nodes" of switches S3, S4 (reference switches) respectively, and is connected to a reference voltage line +VR (first reference voltage line) and a ground voltage line via nodes S of the switches S3, S4 respectively. Similarly, a reference capacitor C2 is connected to the output VOUT and the "−input" of the differential amplifier DAMP via "H2 nodes" of switches S5, S6 (reference switches) respectively, and is connected to a reference voltage line −VR (second reference voltage line) and the ground voltage line via nodes S of the switches S5, S6 respectively. The operation timing of the switched-capacitor circuit 200A is the same as that of the first embodiment (FIG. 3).

"H1" of the switches S3, S4 signifies that they turn on when receiving a high-level control signal H1. "H2" of the switches S5, S6 signifies that they turn on when receiving a high-level control signal H2. In this embodiment, each of the capacitors C1, C2 and the differential amplifier DAMP can be connected by a set of the switches C3, C4 (or C5, C6). Since the number of the switches can be reduced, the switched-capacitor circuit 200A can be simply configured.

FIG. 10 shows a pipelined A/D converter 100A in which the switched-capacitor circuit 200A shown in FIG. 9 is applied to an input front-end circuit (STG1). In the pipelined A/D converter 100A, the switched-capacitor circuit 200A and a switch control circuit 16A are different from the switched-capacitor circuit 200 and the switch control circuit 16 of the pipelined A/D converter 100 of the first embodiment. The other configuration is the same as that of the pipelined A/D converter 100. The switch control circuit 16A adds a logic of a holding signal H to a logic of a digital value outputted from a sub A/D converter ADC of a stage STG1 to generate control signals H1, H2.

The above-described second embodiment can also provide the same effects as those of the first embodiment previously described. In addition, in this embodiment, it is possible to configure the switched-capacitor circuit 200A and the pipelined A/D converter 100A with a small circuit scale.

Figure 11:
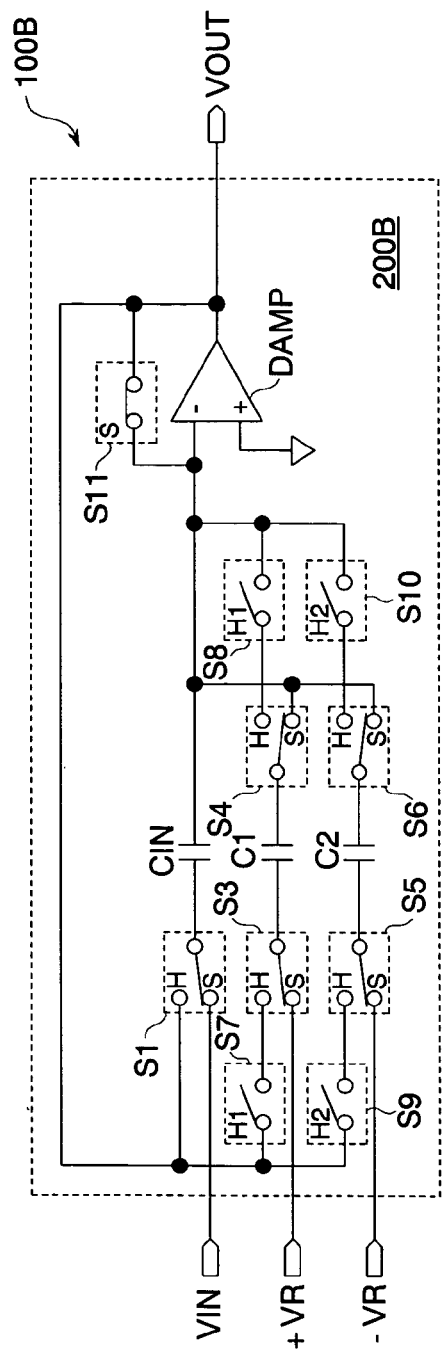
FIG. 11 is a circuit diagram showing a third embodiment of the switched-capacitor circuit and the pipelined A/D converter of the present invention.

FIG. 11 shows a third embodiment of the switched-capacitor circuit and the pipelined A/D converter of the present invention. The same reference numerals or symbols are used to designate the same elements as the elements described in the first embodiment, and detailed description thereof will be omitted. In a pipelined A/D converter 100B of this embodiment, a switched-capacitor circuit 200B is different from the switched-capacitor circuit 200 of the pipelined A/D converter 100 of the first embodiment. The other configuration is the same as that of the pipelined A/D converter 100.

The switched-capacitor circuit 200B is configured such that the input switch S2 is deleted from and a short circuit S11 is added to the switched-capacitor circuit 200 of the first embodiment. Nodes S of reference switches S4, S6 are connected not to a ground voltage line but to a "−input" of a differential amplifier DAMP. In a sampling period, the short switch S11 connects an output VOUT and the "−input" of the differential amplifier DAMP to generate a virtual ground voltage node. Therefore, an offset value of the differential amplifier DAMP can be cancelled in the sampling period. The operation timing of the switched-capacitor circuit 200B is the same as that of the first embodiment (FIG. 3).

The above-described third embodiment can also provide the same effects as those of the first embodiment previously described. In addition, in this embodiment, it is possible to cancel the offset value of the differential amplifier DAMP since the short switch S11 is formed, so that accuracy of an output voltage of the switched-capacitor circuit 200B can be improved.

Figure 12:
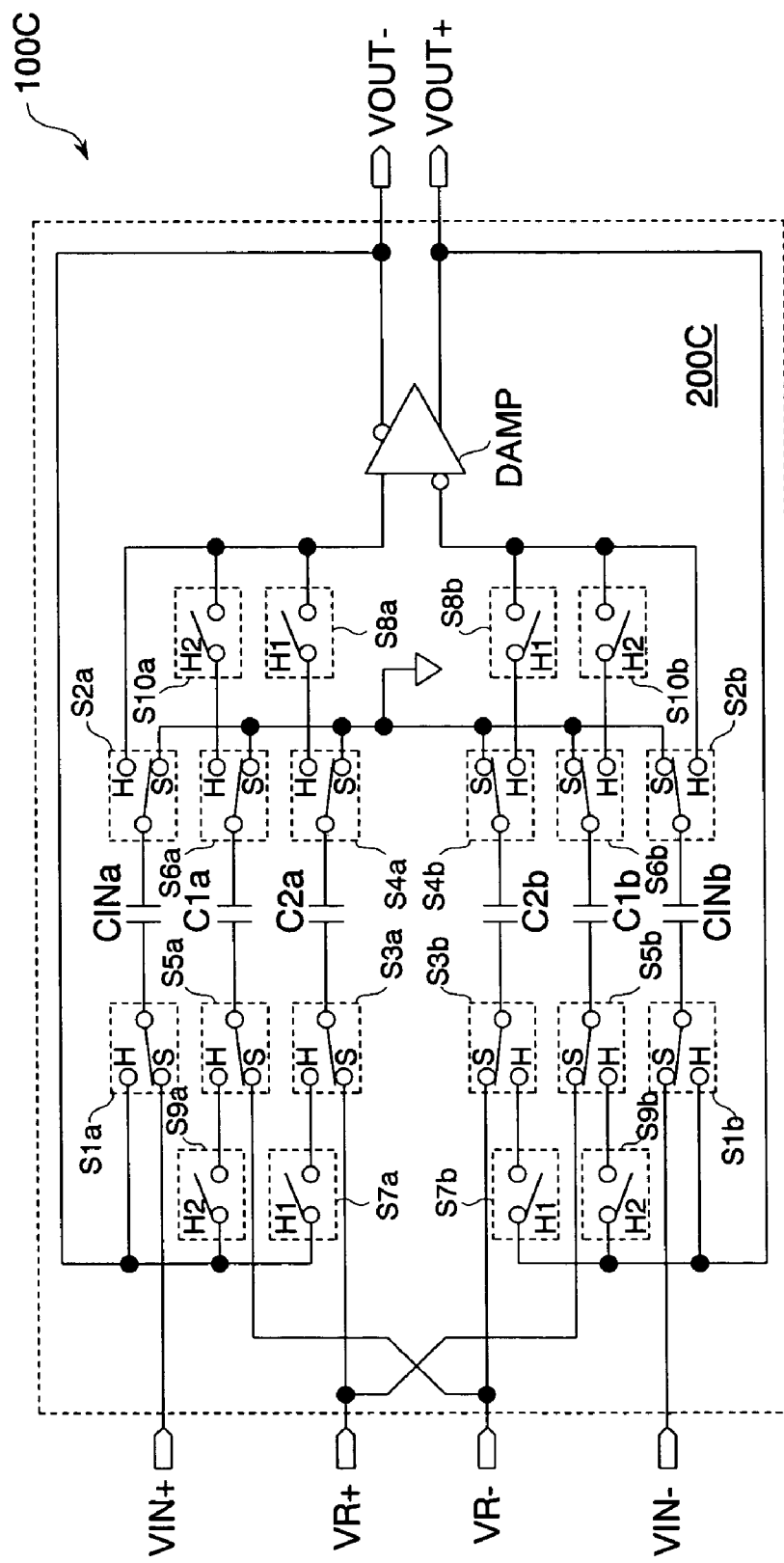
FIG. 12 is a circuit diagram showing a fourth embodiment of the switched-capacitor circuit and the pipelined A/D converter of the present invention.

FIG. 12 shows a fourth embodiment of the switched-capacitor circuit and the pipelined A/D converter of the present invention. The same reference numerals or symbols are used to designate the same elements as the elements described in the first embodiment, and detailed description thereof will be omitted. In a pipelined A/D converter 100C of this embodiment, a switched-capacitor circuit 200C is different from the switched-capacitor circuit 200 of the pipelined A/D converter 100 of the first embodiment. The other configuration is the same as that of the pipelined A/D converter 100.

The switched-capacitor circuit 200C is constituted of a complete differential type having differential inputs and differential outputs. Therefore, the switched-capacitor circuit 200C has: a sampling and holding unit (an upper half excluding a differential amplifier DAMP in the drawing; switches and capacitors whose reference symbols have "a" in the end) that receives an input voltage VIN+ and reference voltages VR+, VR−; and a sampling and holding unit (a lower half excluding the differential amplifier DAMP in the drawing; switches and capacitors whose reference symbols have "b" in the end) that receives an input voltage VIN− and the reference voltages VR+, VR−. A circuit configuration of the upper sampling and holding unit is the same as that of the sampling and holding unit of the switched-capacitor circuit 200 (a portion excluding the differential amplifier DAMP). A circuit configuration of the lower sampling and holding unit is the same as that of the sampling and holding unit of the switched-capacitor circuit 200 (the portion excluding the differential amplifier DAMP) except that the capacitors C1$b$, C2$b$ corresponding to the reference voltages VR+, VR− and the switches S3$b$ to S10$b$ are provided in place. Here, a value equal to the "input voltage VIN+" from which the "input voltage VIN−" is subtracted signifies the input voltage VIN of the first embodiment. A value equal to the "reference voltage VR+" from which the "reference voltage VR−" is subtracted signifies the reference voltage +VR of the first embodiment. A value equal to the "reference voltage VR−" from which the "reference voltage VR+" is subtracted signifies the reference voltage −VR of the first embodiment.

In a holding period, an output voltage "VOUT$^+$−VOUT$^−$" when a control signal H1 is at high level and that when the control signal H2 is at high level have the following values.

½((VIN$^+$−VIN$^−$)+(VR$^+$−VR$^−$))   (H1="H")

½((VIN$^+$−VIN$^−$)−(VR$^+$−VR$^−$))   (H2="H")

The above-described fourth embodiment can also provide the same effects as those of the first embodiment previously described. Specifically, in the switched-capacitor circuit 200C of a complete differential type and the pipelined A/D converter 100C using this switched-capacitor circuit 200C, it is also possible to reduce power consumption or to improve the operating speed.

Figure 13:
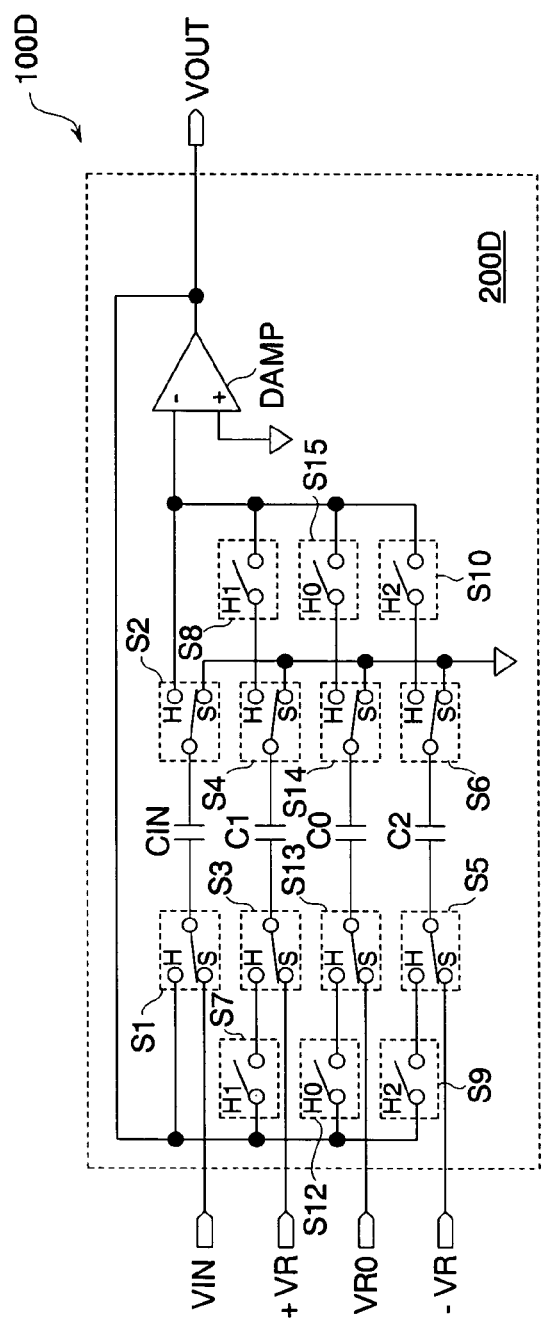
FIG. 13 is a circuit diagram showing a fifth embodiment of the switched-capacitor circuit and the pipelined A/D converter of the present invention.

FIG. 13 shows a fifth embodiment of the switched-capacitor circuit and the pipelined A/D converter of the present invention. The same reference numerals or symbols are used to designate the same elements as the elements described in the first embodiment, and detailed description thereof will be omitted. In a pipelined A/D converter 100D of this embodiment, a switched-capacitor circuit 200D is different from the switched-capacitor circuit 200 of the pipelined A/D converter 100 of the first embodiment. The other configuration is the same as that of the pipelined A/D converter 100 (FIG. 2) except that a switch control circuit (not shown) outputs not only control signals H1, H2 but also a control signal H0 and that the switched-capacitor circuit 200D receives not only reference voltages +VR, −VR but also VR0.

The switched-capacitor circuit 200D is configured such that a reference capacitor C0 and switches S12 to S15 are added in the switched-capacitor circuit 200 of the first embodiment. Similarly to the reference capacitors C1, C2, the reference capacitor C0 is connected to an output VOUT and a "−input" of a differential amplifier DAMP via nodes H of reference switches S13, S14 and via reference switches S12, S15 respectively, and is connected to a third reference voltage line VR0 and a ground voltage line via nodes S of the switches S13, S14 respectively. The reference voltage VR0 is set at a mean value of the reference voltages +VR, −VR.

In this embodiment, each of stages STG1 to STG4 (see FIG. 2) of the pipelined A/D converter 100D determines 1.5 bits. in a holding period, the switched-capacitor circuit 200D is controlled by a switch control circuit to connect a capacitor C1 in which the reference voltage +VR is accumulated to the differential amplifier DAMP when a sub A/D converter ADC on a preceding stage outputs a digital value "11" (indicating a logical value "1"). The output voltage VOUT at this time is represented by an expression (8). Similarly, when the sub A/D converter ADC on the preceding stage outputs a digital value "00" (indicating a logical value "0"), a capacitor C2 in which the reference voltage −VR is accumulated to the differential amplifier DAMP. The output voltage VOUT at this time is represented by an expression (9). When the sub A/D converter ADC on the preceding stage outputs a digital value "01" (indicating a logical value "indeterminate"), a capacitor C0 in which the reference voltage VR0 (for example, a ground voltage) is accumulated to the differential amplifier DAMP. The output voltage VOUT at this time is represented by an expression (10).

$$VOUT=\tfrac{1}{2}(VIN+VR) \quad (8)$$

$$VOUT=\tfrac{1}{2}VIN \quad (9)$$

$$VOUT=\tfrac{1}{2}(VIN-VR) \quad (10)$$

The above-described fifth embodiment can also provide the same effects as those of the first embodiment previously described. In addition, when the present invention is applied to the switched-capacitor circuit 200D determining 1.5 bits and the pipelined A/D converter 100D having this switched-capacitor circuit 200D, it is possible to reduce power consumption of the high-accuracy pipelined A/D converter 100D or to improve the operating speed thereof.

Figure 14:
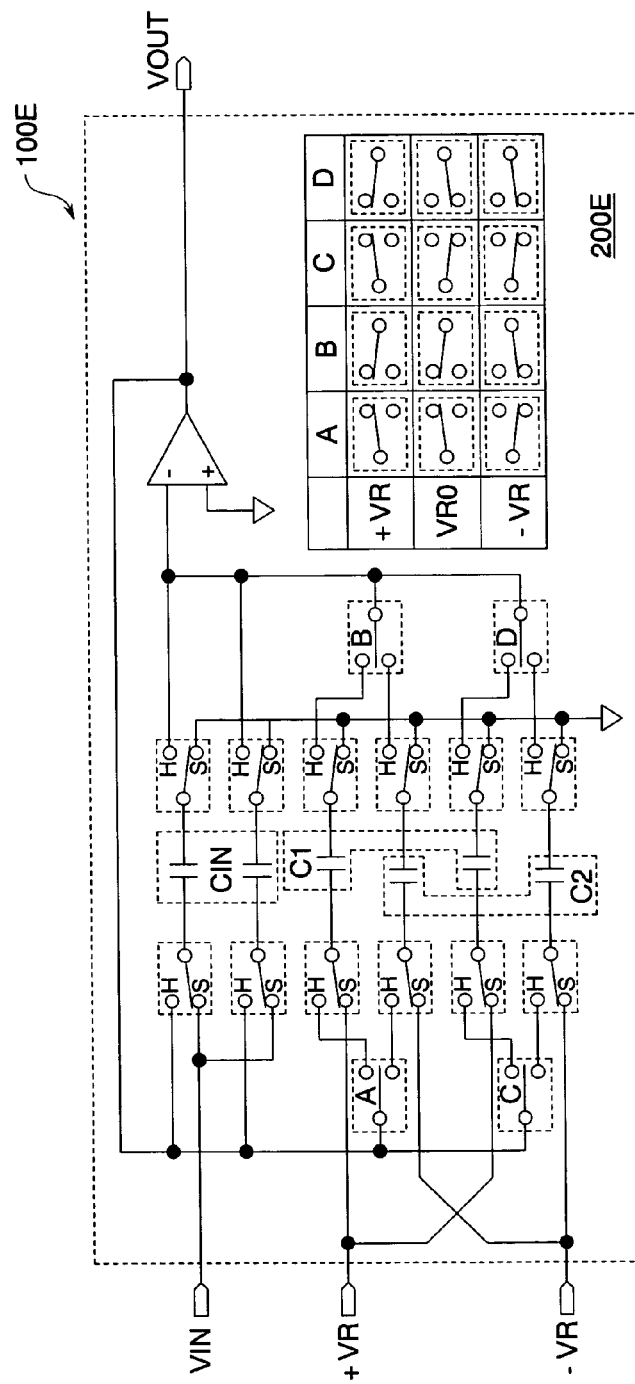
FIG. 14 is a circuit diagram showing a sixth embodiment of the switched-capacitor circuit and the pipelined A/D converter of the present invention.

FIG. 14 shows a sixth embodiment of the switched-capacitor circuit and the pipelined A/D converter of the present invention. The same reference numerals or symbols are used to designate the same elements as the elements described in the first embodiment, and detailed description thereof will be omitted. In a pipelined A/D converter 100E of this embodiment, a switched-capacitor circuit 200E is different from the switched-capacitor circuit 200 of the pipelined A/D converter 100 of the first embodiment. The other configuration is the same as that of the pipelined A/D converter 100.

In the switched-capacitor circuit 200E, each of capacitors CIN, C1, C2 makes a pair with a sub-capacitor. Switches connecting the capacitors CIN, C1, C2 to voltage lines VIN, +VR, −VR, a ground voltage line, and a differential amplifier DAMP are formed to correspond to the sub-capacitors respectively. In this embodiment, each of stages STG1 to STG4 (see FIG. 2) of the pipelined A/D converter 100E determines 1.5 bits as in the fifth embodiment.

The switched-capacitor circuit 200E is controlled by a switch control circuit 16 (see FIG. 2) and switches the state of switches A, B, C, D to the state shown in the row of "+VR" in the drawing when a sub A/D converter ADC on a preceding stage outputs a digital value "11" (indicating a logical value "1"). An output voltage VOUT at this time is represented by an expression (11) (the same value as that of the expression (8)). Similarly, when the sub A/D converter ADC on the preceding stage outputs a digital value "01" (indicating a logical value "indeterminate"), the state of the switches A, B, C, D is changed to the state shown in the row of "VR0" in the drawing. The output voltage VOUT at this time is represented by an expression (12) (the same value as that of the expression (9)). When the sub A/D converter ADC on the preceding stage outputs a digital value "00" (indicating a logical value "0"), the state of the switches A, B, C, D is changed to the state shown in the row "−VR". The output voltage VOUT at this time is represented by an expression (13) (the same value as that of the expression (10)).

$$VOUT = 1/4(2 \times VIN + VR + VR) \qquad (11)$$
$$= 1/2(VIN + VR)$$

$$VOUT = 1/4(2 \times VIN + VR - VR) \qquad (12)$$
$$= 1/2VIN$$

$$VOUT = 1/4(2 \times VIN - VR - VR) \qquad (13)$$
$$= 1/2(VIN - VR)$$

The above-described sixth embodiment can also provide the same effects as those of the first and fifth embodiments previously described. In addition, since the reference voltage VR0 is not necessary, a need for a voltage generator for generating the reference voltage VR0 can be eliminated. As a result, it is possible to reduce circuit scale and power consumption of a system on which the pipelined A/D converter 100E is mounted.

Figure 15:
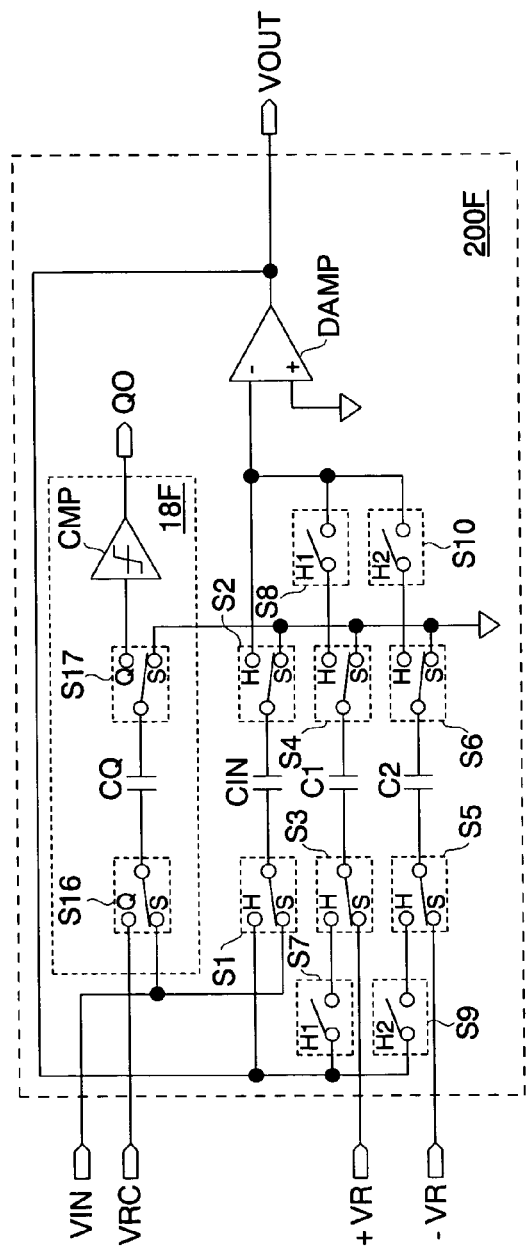
FIG. 15 is a circuit diagram showing details of a switched-capacitor circuit of the seventh embodiment of the present invention.
Figure 16:
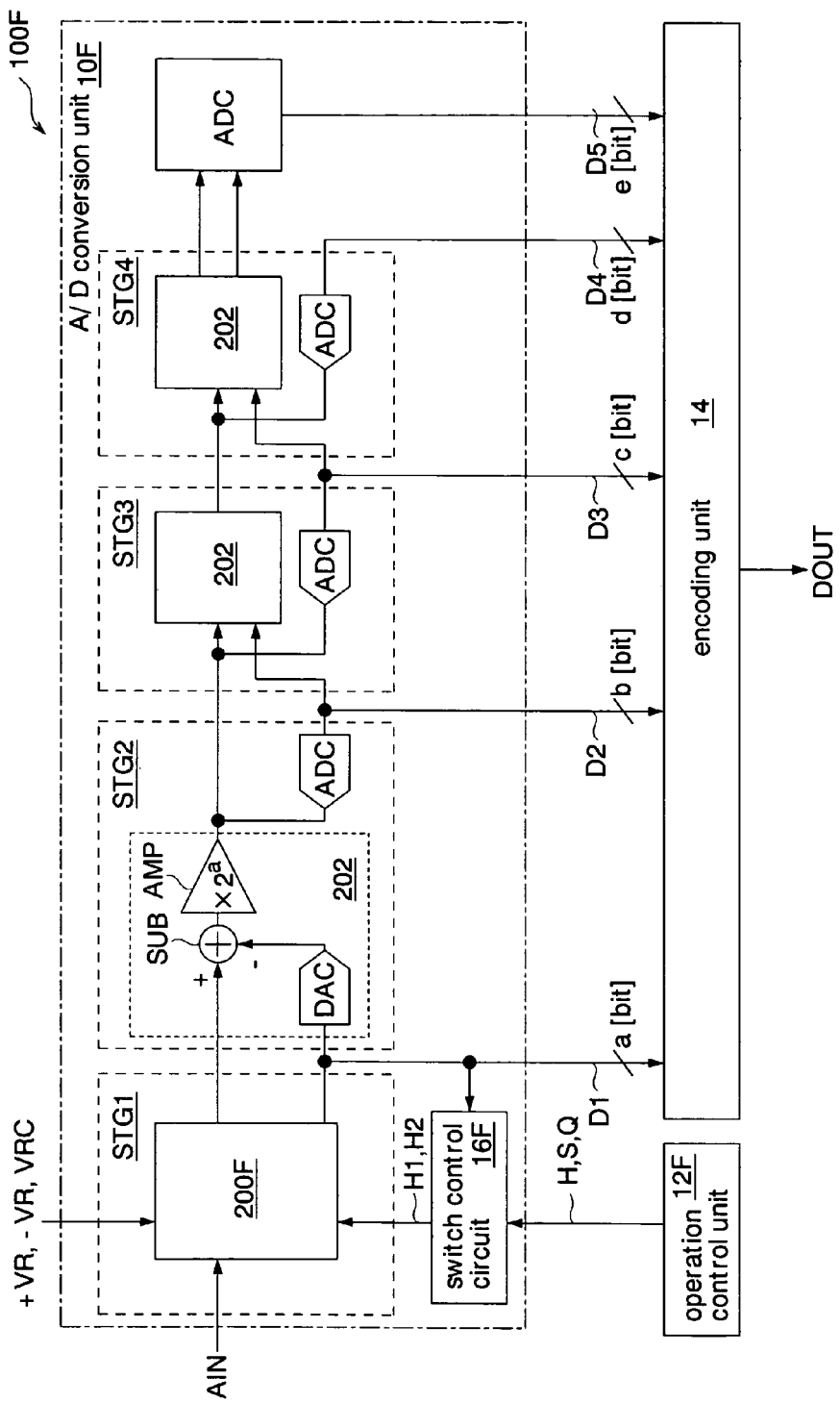
FIG. 16 is a block diagram showing a pipelined A/D converter of the seventh embodiment of the present invention.

FIG. 15 and FIG. 16 show a seventh embodiment of the switched-capacitor circuit and the pipelined A/D converter of the present invention. The same reference numerals or symbols are used to designate the same elements as the elements described in the first embodiment, and detailed description thereof will be omitted.

In FIG. 15, a switched-capacitor circuit 200F is configured such that a comparing circuit 18F is added in the switched-capacitor circuit 200 of the first embodiment. The comparing circuit 18F has a comparison capacitor CQ, comparing switches S16, S17, and a comparator CMP. One end and the other end of the comparison capacitor CQ are connected to a comparison voltage line VRC and an input of the comparator CMP via nodes Q of the comparing switches S16, S17 respectively, and are connected to an input voltage line VIN and a ground voltage line via nodes S of the switches S16, S17 respectively. The comparison capacitor CQ and the comparing switches S16, S17 operate as a sampling and holding circuit sampling/holding an input voltage VIN. The comparator CMP operates as a sub A/D converter ADC converting the sampled input voltage VIN to a digital value.

In the comparing circuit 18F, in a sampling period (first period), the comparison capacitor CQ is connected to the input voltage line VIN at one end thereof and is connected to the ground voltage line at the other end thereof, so that the input voltage VIN is sampled by the comparison capacitor CQ. In a comparing period (third period) subsequent to the sampling period, the comparison capacitor CQ is connected to the comparison voltage line VRC at one end thereof and is connected to the input of the comparator CMP at the other end thereof. Then, in the comparing period, a digital value QO corresponding to the input voltage VIN is generated. The digital value QO of the switched-capacitor circuit 200F corresponds to digital values D1 to D4 shown in FIG. 16. In a holding period subsequent to the comparing period, a switch control circuit 16F shown in FIG. 16 outputs one of control signals H1, H2 according to the digital value QO.

FIG. 16 shows a pipelined A/D converter 100F in which the switched-capacitor circuit 200F shown in FIG. 15 is applied to an input front-end circuit (STG1). The switched-capacitor circuit 200F of the pipelined A/D converter 100F includes the sub A/D converter ADC of the stage STG1 shown in FIG. 2. As described in the first embodiment, a sampling and holding circuit of an input front-end circuit generally has a built-in amplifier with large power consumption and large circuit scale in order to improve accuracy. In this embodiment, it is also possible to simply configure a sampling and holding circuit of an input front-end circuit as shown in FIG. 15. Therefore, it is possible to greatly reduce power consumption and circuit scale compared with those of a conventional sampling and holding circuit.

An operation control unit 12F has, in addition to the function of the operation control unit 12 of the first embodiment, a function of outputting a comparing period signal Q determining the comparing period that is set between the sampling period and the holding period. The switch control circuit 16F has a function of keeping one of the control signals H1, H2 at high level in the holding period, according to the digital value D1 (equal to the aforesaid QO in FIG. 15) outputted from the sub A/D converter ADC included in the switched-capacitor circuit 200F. The other configuration is the same as that of the pipelined A/D converter 100.

Figure 17:
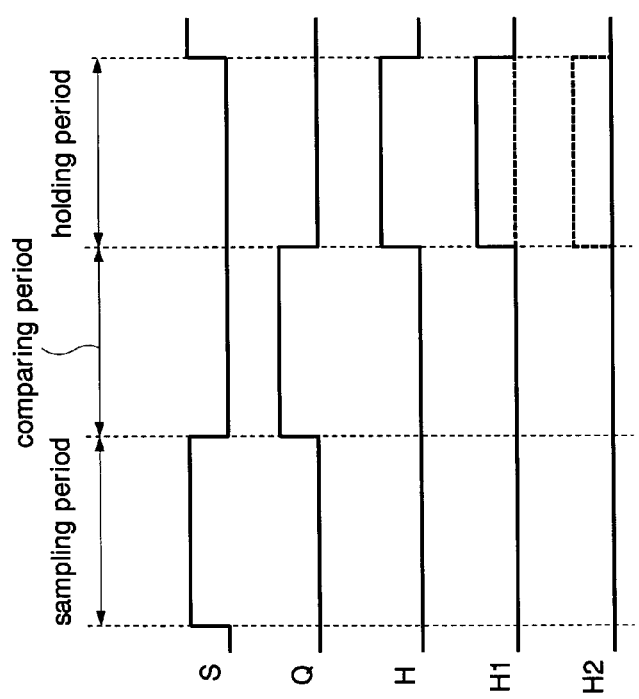
FIG. 17 is a timing chart showing operations of the switched-capacitor circuit shown in FIG. 15.

FIG. 17 shows operations of the switched-capacitor circuit 200F shown in FIG. 15. Detailed description of the same operations as those of the first embodiment (FIG. 3) will be omitted. The switched-capacitor circuit 200F executes a sampling operation, a comparing operation, and a holding operation in the sampling period, the comparing period, and the holding period respectively which are changed over in sequence in synchronization with transition edges of a clock CLK. The sampling period and the holding period are the same as those of the first embodiment. The comparing period is a high-level period of the comparing period signal Q. In the holding period, one of the control signals H1, H2 is kept at high level according to the digital value QO determined in the comparing period, and the holding operation is executed.

The above-described seventh embodiment can also provide the same effects as those of the first and sixth embodiments previously described. In addition, since the switched-capacitor circuit 200F has the comparing circuit 18F formed therein, the switched-capacitor circuit 200F can have the functions of a sampling and holding circuit and a sub A/D converter ADC. Therefore, when the switched-capacitor circuit 200F is applied to the first stage STG1 of the pipelined A/D converter 100F, it is possible to simply configure a sampling and holding circuit of an input front-end circuit to greatly reduce power consumption and circuit scale compared with conventional ones.

Figure 18:
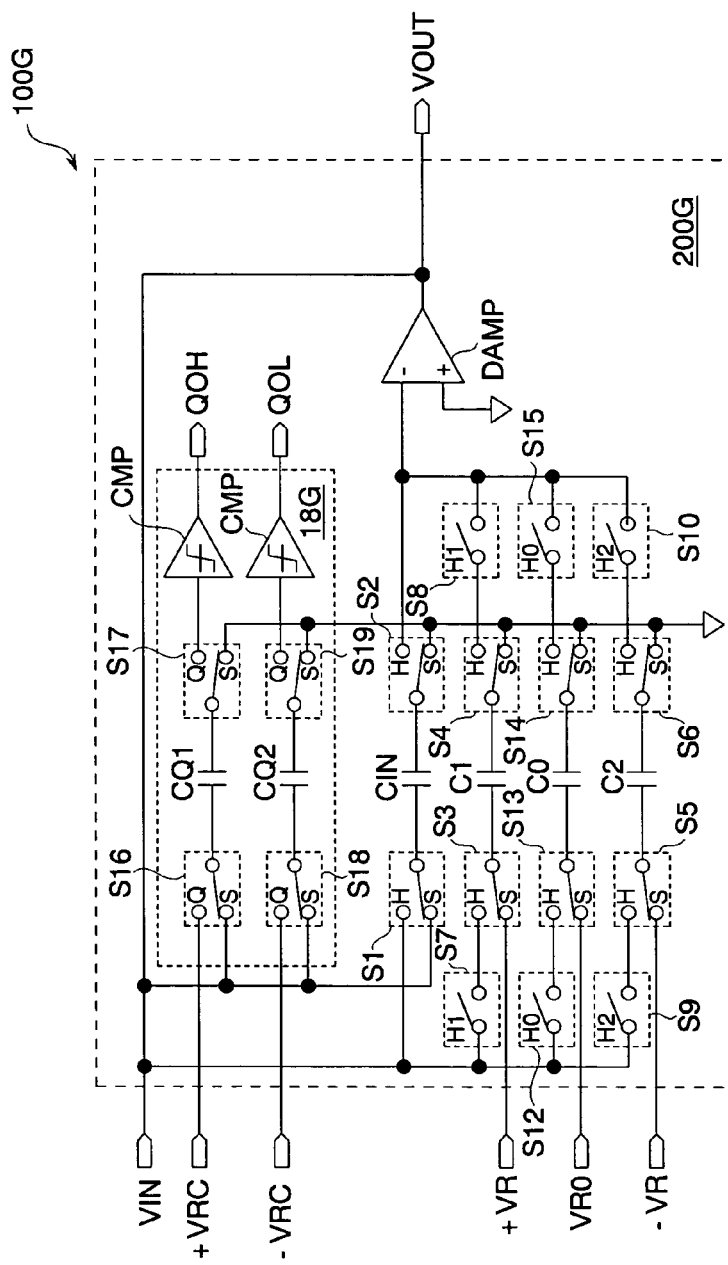
FIG. 18 is a circuit diagram showing an eighth embodiment of the switched-capacitor circuit and the pipelined A/D converter of the present invention.

FIG. 18 shows an eighth embodiment of the switched-capacitor circuit and the pipelined A/D converter of the present invention. The same reference numerals or symbols are used to designate the same elements as the elements described in the first, fifth, and seventh embodiments, and detailed description thereof will be omitted. A switched-capacitor circuit 200G of a pipelined A/D converter 100G of this embodiment is configured such that a comparing circuit 18G is added in the switched-capacitor circuit 200D of the fifth embodiment. The other configuration is the same as that of the pipelined A/D converter 100F (FIG. 15) except that a switch control circuit (not shown) outputs not only control signals H1, H2 but also a control signal H0 and that the switched-capacitor circuit 200G receives not only reference voltages +VR, −VR but also a reference voltage VR0.

The comparing circuit 18G has comparison capacitors CQ+, CQ−, comparing switches S16 to S19, and comparators CMP1, CMP2 corresponding to the comparison capacitors CQ+, CQ− respectively. One end and the other end of the comparison capacitor CQ+ are connected to a comparison voltage line +VRC and an input of the comparator CMP1 via nodes Q of the comparing switches S16, S17 respectively, and are connected to an input voltage line VIN and a ground voltage line via nodes S of the switches S16, S17 respectively. One end and the other end of the comparison capacitor CQ− are connected to a comparison voltage line −VRC and an input of the comparator CMP2 via nodes Q of the comparing switches S18, S19 respectively, and are connected to the input voltage line VIN and the ground voltage line via nodes S of the switches S18, S19 respectively. The comparison capacitor CQ+ and the comparing switches S16, S17, and the comparison capacitor CQ− and the comparing switches S18, S19 operate as sampling and holding circuits sampling/holding the input voltage VIN. The comparators CMP1, CMP2 operate as sub A/D converters ADC converting the sampled input voltage VIN to digital values QOH, QOL.

Figure 19:
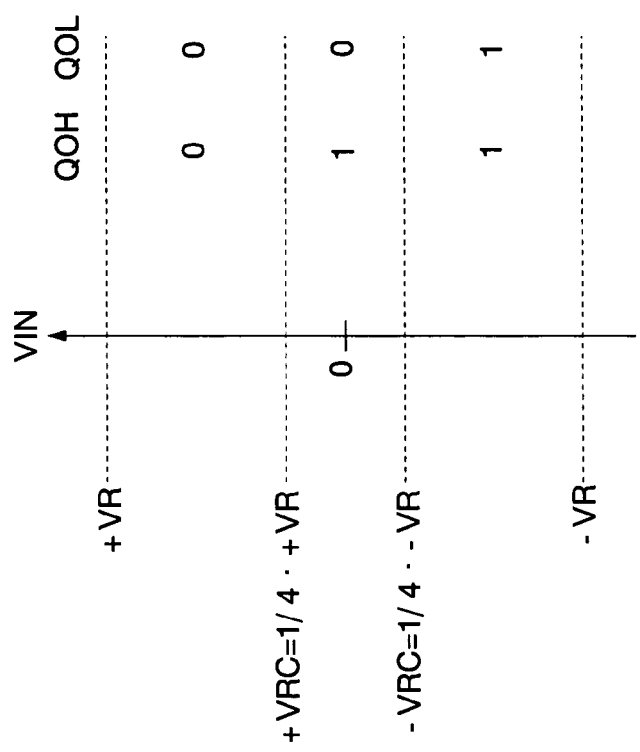
FIG. 19 is a timing chart showing operations of a comparing circuit shown in FIG. 18.

FIG. 19 shows operations of the comparing circuit 18G in a comparing period. Comparison voltages +VRC, −VRC are set to ¼ of reference voltages +VR, −VR respectively. The comparing circuit 18G outputs the digital values QOH, QOL="00" when the input voltage VIN is larger than the comparison voltage +VRC, outputs the digital values QOH, QOL="1" when the input voltage VIN is smaller than the comparison voltage −VRC, and outputs the digital values QOH, QOL="10" when the input voltage VIN is between the comparison voltages −VRC and +VRC. Therefore, the comparing circuit 18G functions as a sampling and holding circuit and a sub A/D converter ADC determining 1.5 bits. In the switched-capacitor circuit 200G, the switches change the operation state according to the digital values QOH, QOL outputted from the comparing circuit 18G and the operation timing of the switched-capacitor circuit 200G is the same as that of the seventh embodiment (FIG. 17).

The above-described eighth embodiment can also provide the same effects as those of the first, fifth, and seventh embodiments previously described. Specifically, when the present invention is applied to a switched-capacitor circuit determining 1.5 bits and a pipelined A/D converter, it is possible to simply configure a sampling and holding circuit of an input front-end circuit, so that power consumption and circuit scale can be greatly reduced compared with conventional ones.

Incidentally, the foregoing embodiments have described the examples where the switched-capacitor circuit of the present invention is applied to the input front-end circuit (STG1) of the pipelined A/D converter. The present invention is not limited to such embodiments. For example, when the switched-capacitor circuit of the present invention is applied to a plurality of stages STG1 in a pipelined A/D converter, power consumption can be greatly reduced and circuit scale can be greatly reduced.

The foregoing embodiments have described the examples where the switched-capacitor circuit of the present invention is applied to a pipelined A/D converter in which each stage STG determines 1 bit or 1.5 bits. The present invention is not limited to such embodiments. For example, the present invention may be applied to a pipelined A/D converter in which each stage STG determines 2 bits or more.

Figure 20:
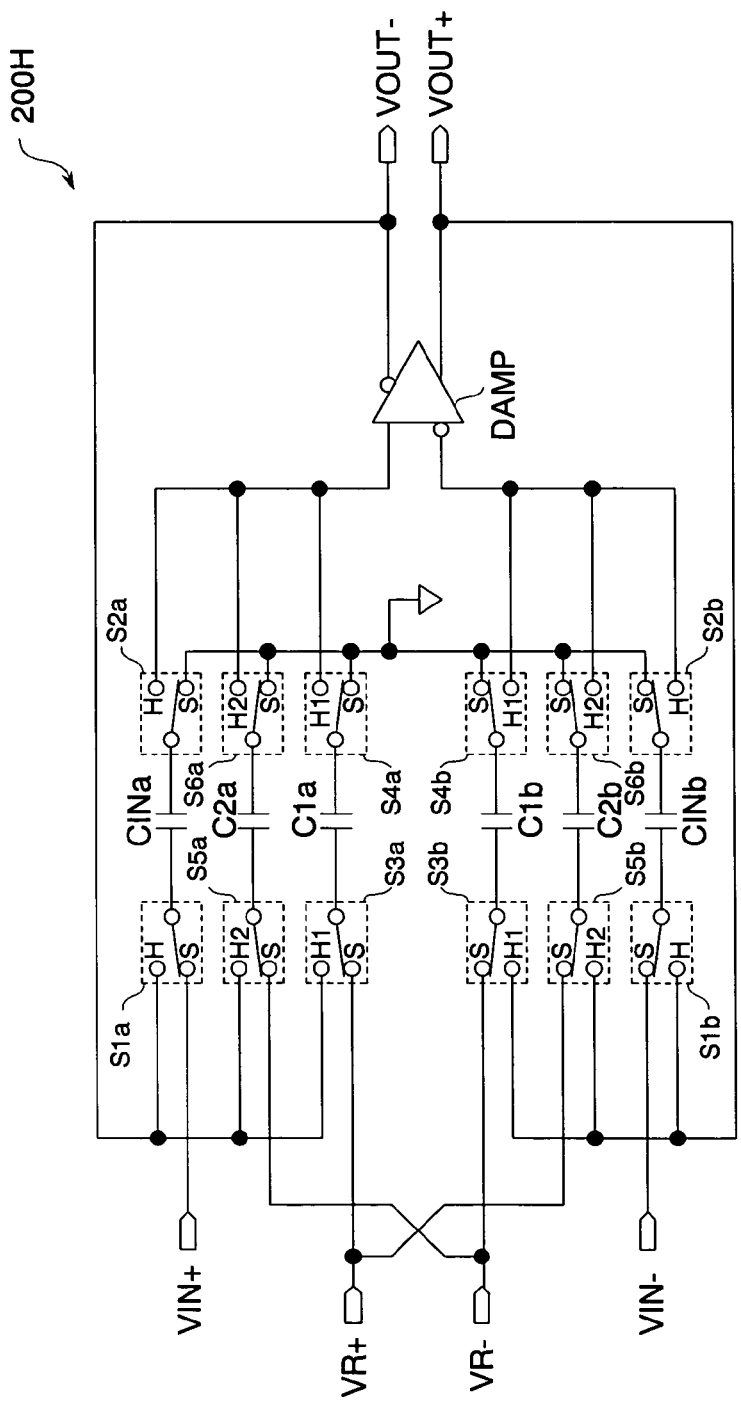
FIG. 20 is a circuit diagram showing another example of the switched-capacitor circuit.
Figure 21:
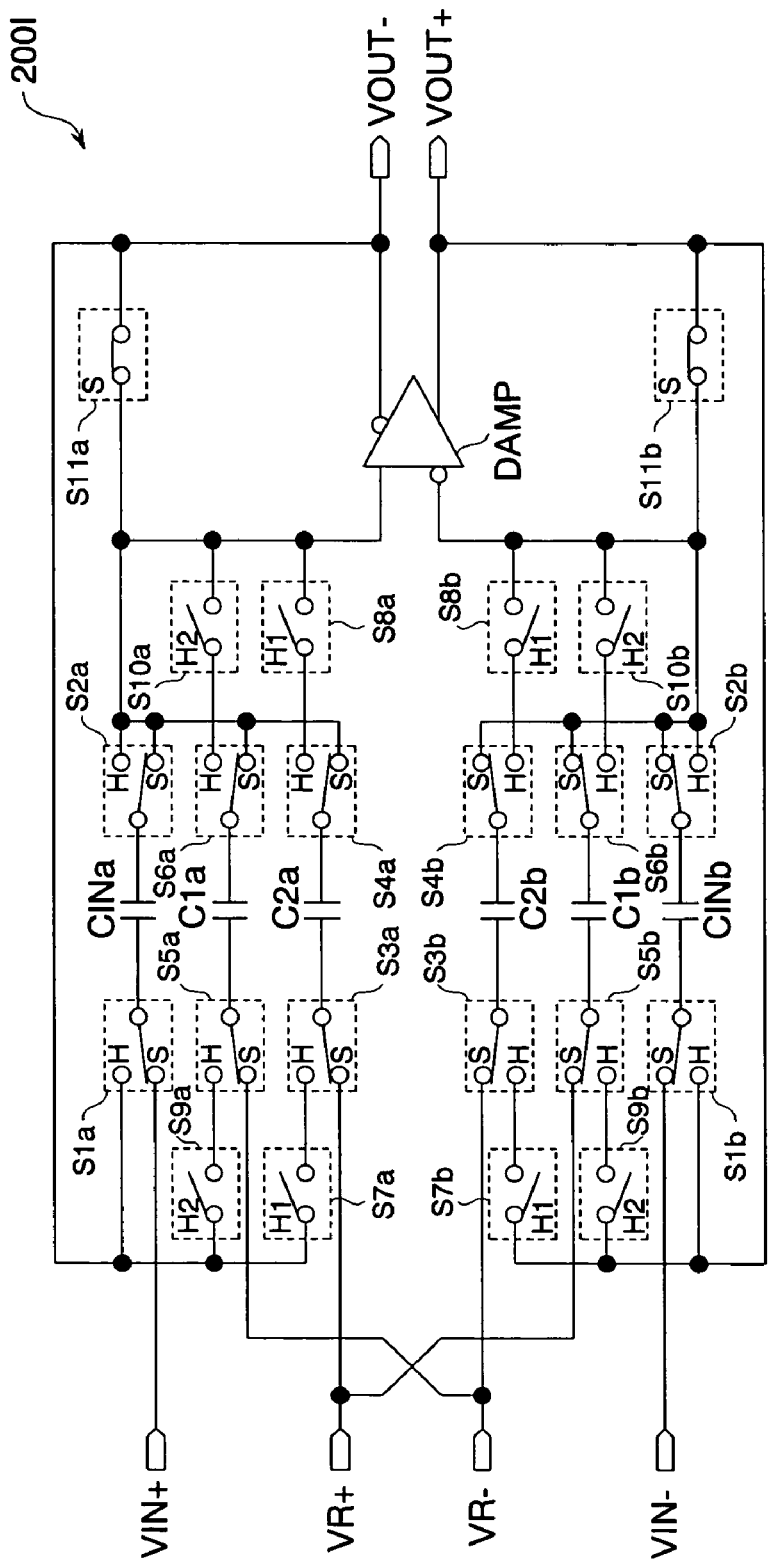
FIG. 21 is a circuit diagram showing another example of the switched-capacitor circuit.
Figure 22:
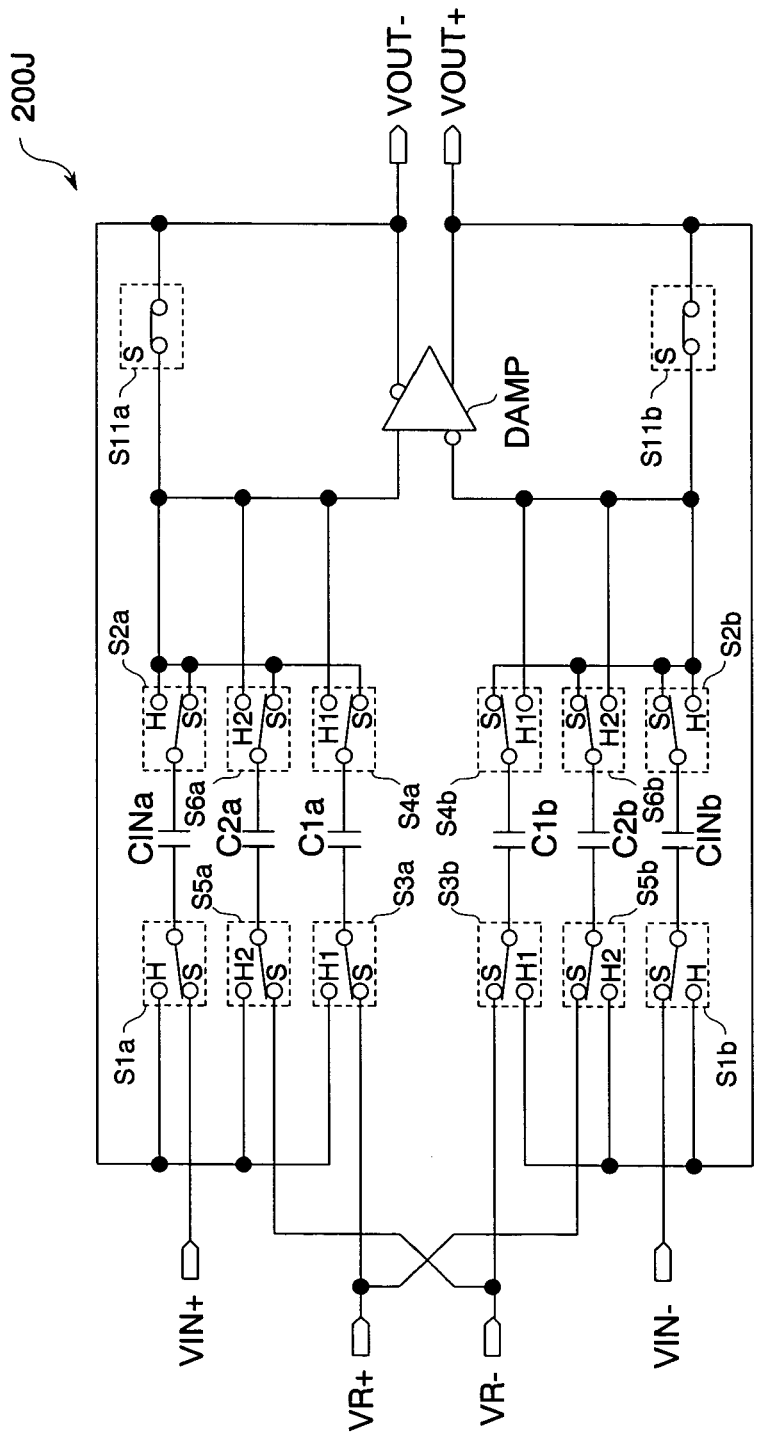
FIG. 22 is a circuit diagram showing another example of the switched-capacitor circuit.

The switched-capacitor circuit of the present invention is not limited to the examples described above, but may be switched-capacitor circuits 200H to 200U shown in FIG. 20 to FIG. 33. The switched-capacitor circuit 200H in FIG. 20 is an example where the switched-capacitor circuit 200A of the second embodiment (FIG. 10) is changed to a complete differential type. The switched-capacitor circuit 200I in FIG. 21 is an example where the switched-capacitor circuit 200B of the third embodiment (FIG. 11) is changed to a complete differential type. The switched-capacitor circuit 200J in FIG. 22 is an example where the switched-capacitor circuit 200A of the second embodiment (FIG. 10) is changed to a virtual ground type and is further changed to a complete differential type.

Figure 23:
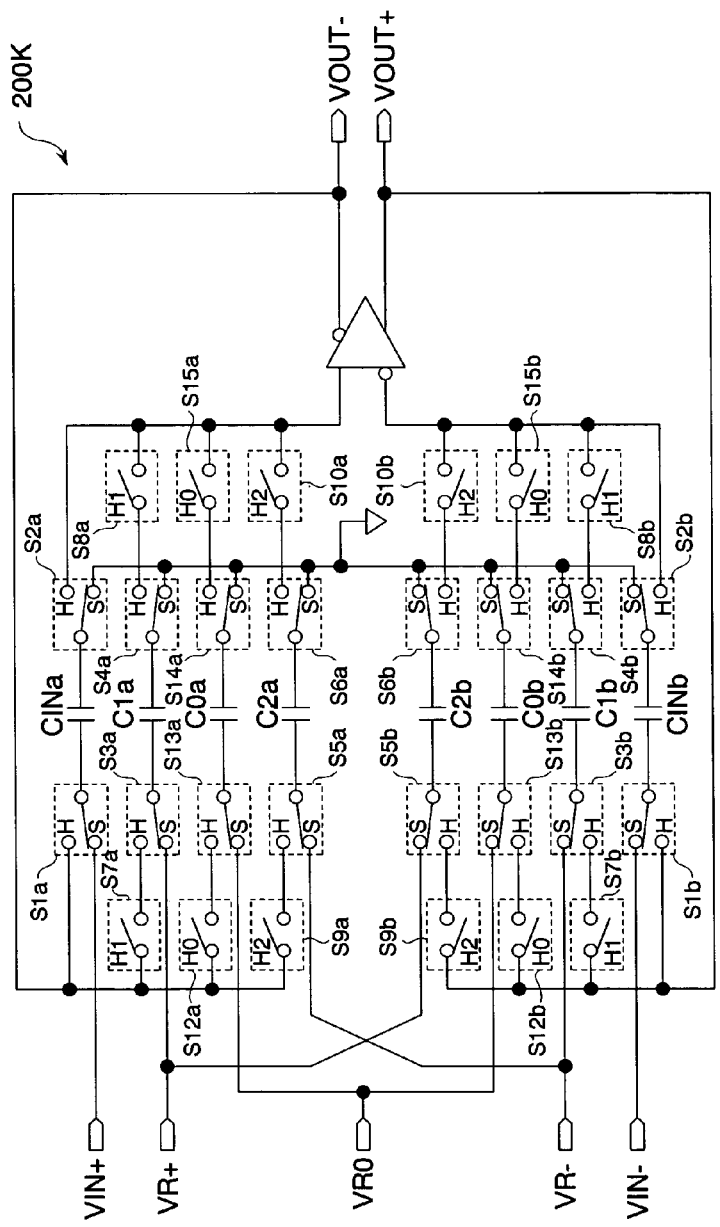
FIG. 23 is a circuit diagram showing another example of the switched-capacitor circuit.
Figure 24:
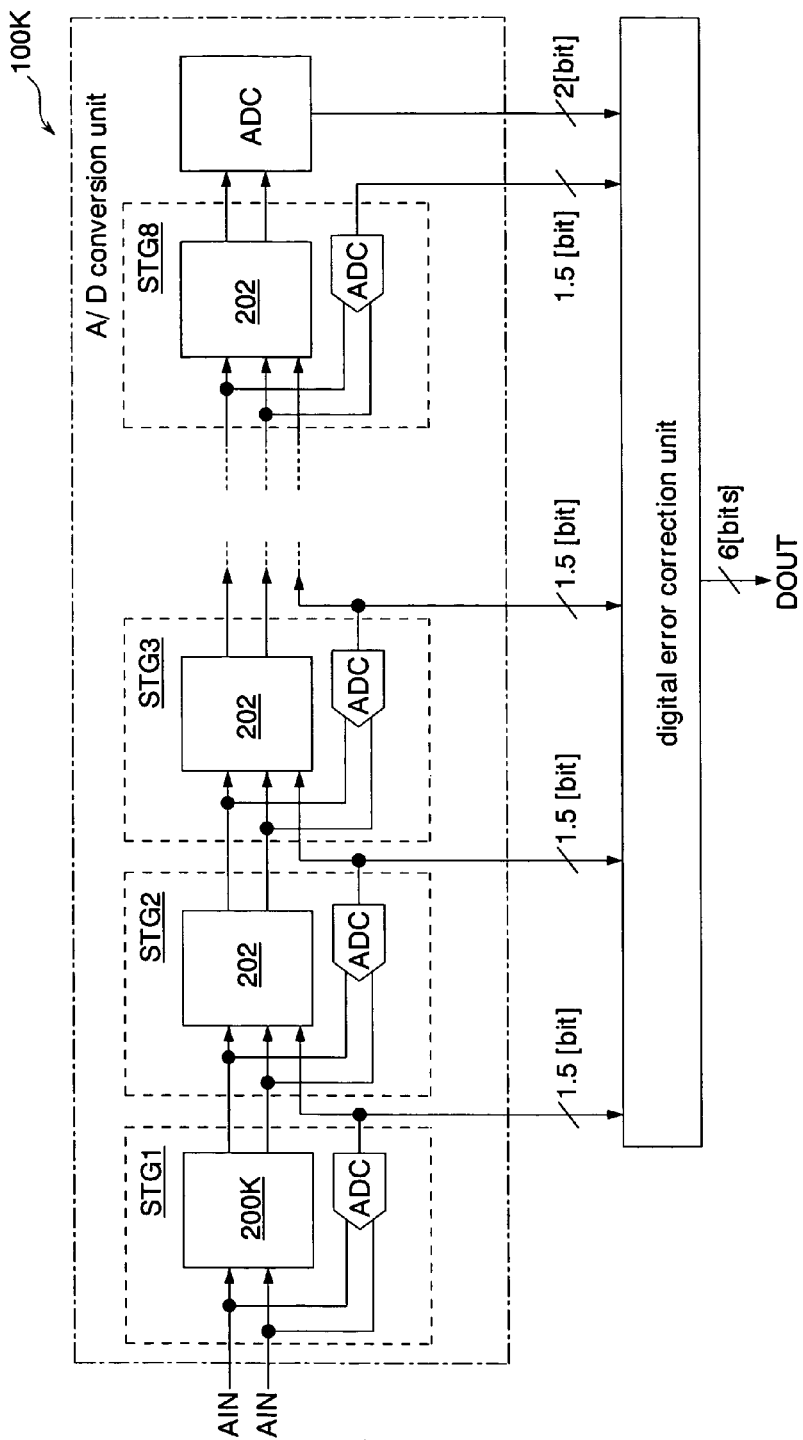
FIG. 24 is a block diagram showing an example of a pipelined A/D converter to which the switched-capacitor circuit shown in FIG. 23 is applied.
Figure 25:
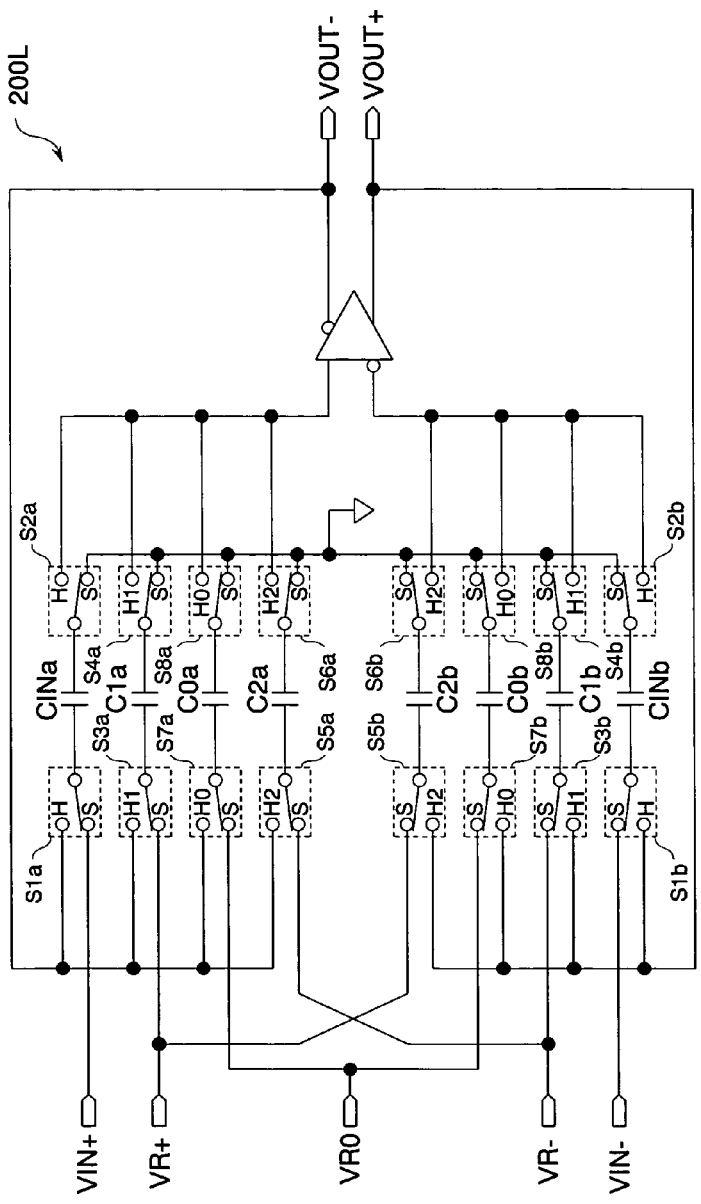
FIG. 25 is a circuit diagram showing another example of the switched-capacitor circuit.

The switched-capacitor circuit 200K in FIG. 23 is an example where the switched-capacitor circuit 200D of the fifth embodiment (FIG. 13) is changed to a complete differential type. FIG. 24 shows a pipelined A/D converter 100K in which the switched-capacitor circuit 200K shown in FIG. 23 is applied to an input front-end circuit (STG1). The switched-capacitor circuit 200L in FIG. 25 is an example where the switched-capacitor circuit 200A of the second embodiment (FIG. 10) is changed to a type determining 1.5 bits and is further changed to a complete differential type. In FIG. 23 and FIG. 25, an output voltage "VOUT$^+$−VOUT$^-$" in a holding period has the following values respectively when a control signal H1 is at high level, when a control signal H0 is at high level, and when a control signal H2 is at high level.

$$½((VIN^+ - VIN^-)+(VR^+ - VR^-)) \qquad (H1="H")$$

$$½(VIN^+ - VIN^-) \qquad (H0="H")$$

$$½((VIN^+ - VIN^-)-(VR^+ - VR^-)) \qquad (H2="H")$$

Figure 26:
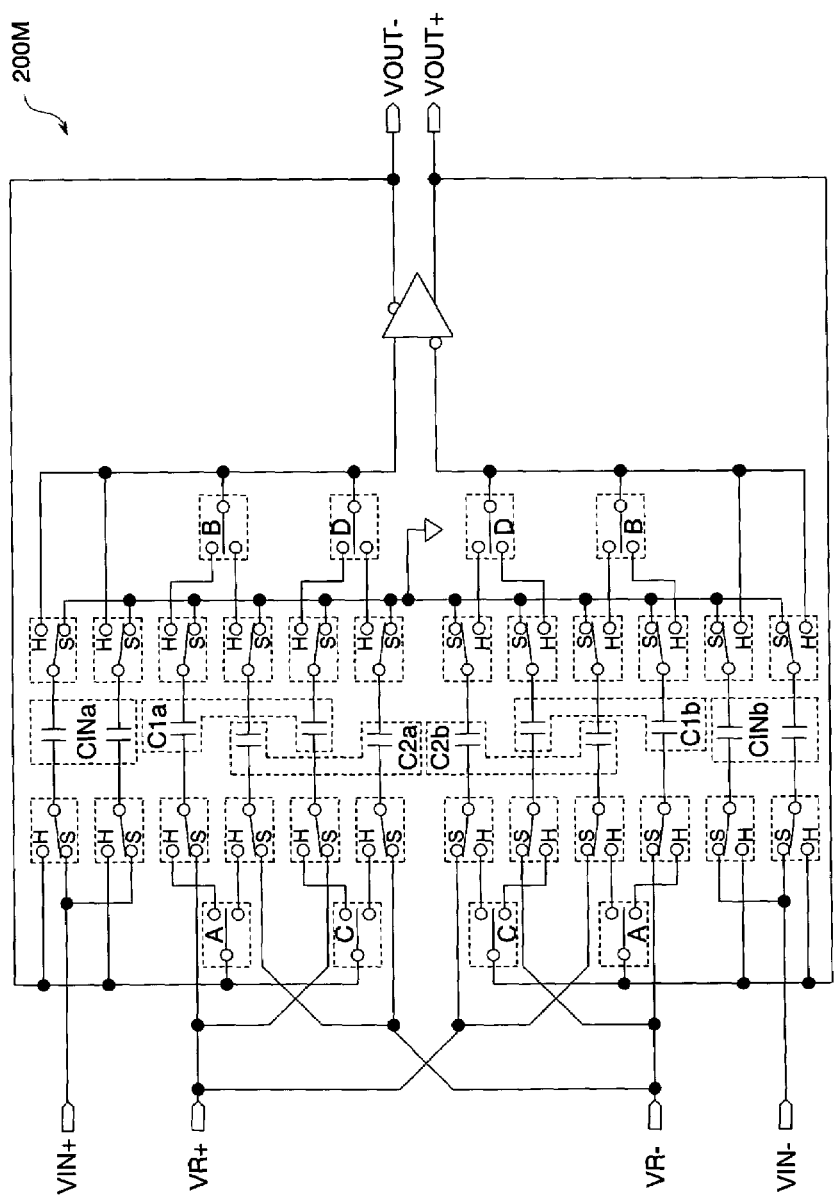
FIG. 26 is a circuit diagram showing another example of the switched-capacitor circuit.
Figure 27:
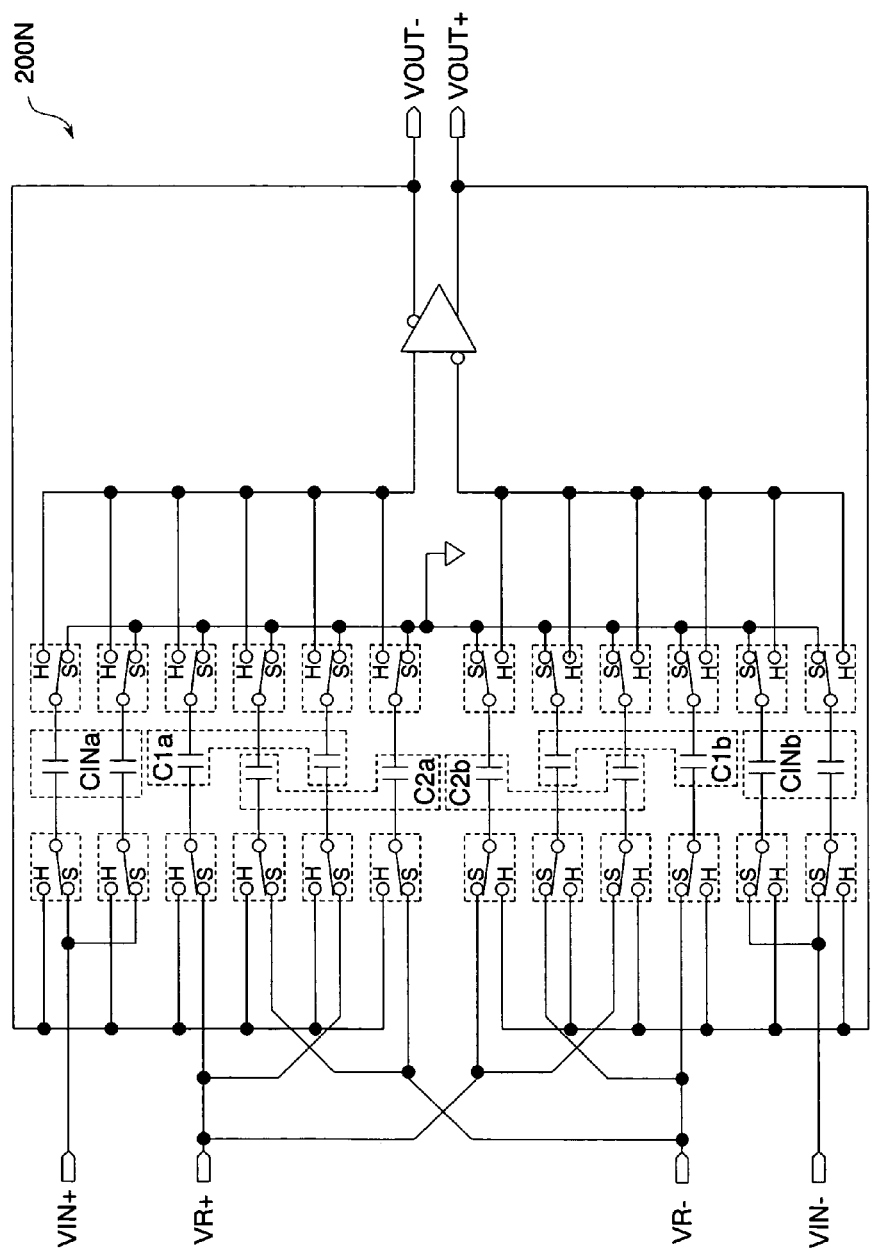
FIG. 27 is a circuit diagram showing another example of the switched-capacitor circuit.

The switched-capacitor circuit 200M in FIG. 26 is an example where the switched-capacitor circuit 200E of the sixth embodiment (FIG. 14) is changed to a complete differential type. The switched-capacitor circuit 200N in FIG. 27 is an example where part of the switches of the switched-capacitor circuit 200E of the sixth embodiment (FIG. 14) are deleted in the same manner as in the second embodiment and the switched-capacitor circuit 200E is further changed to a complete differential type.

Figure 28:
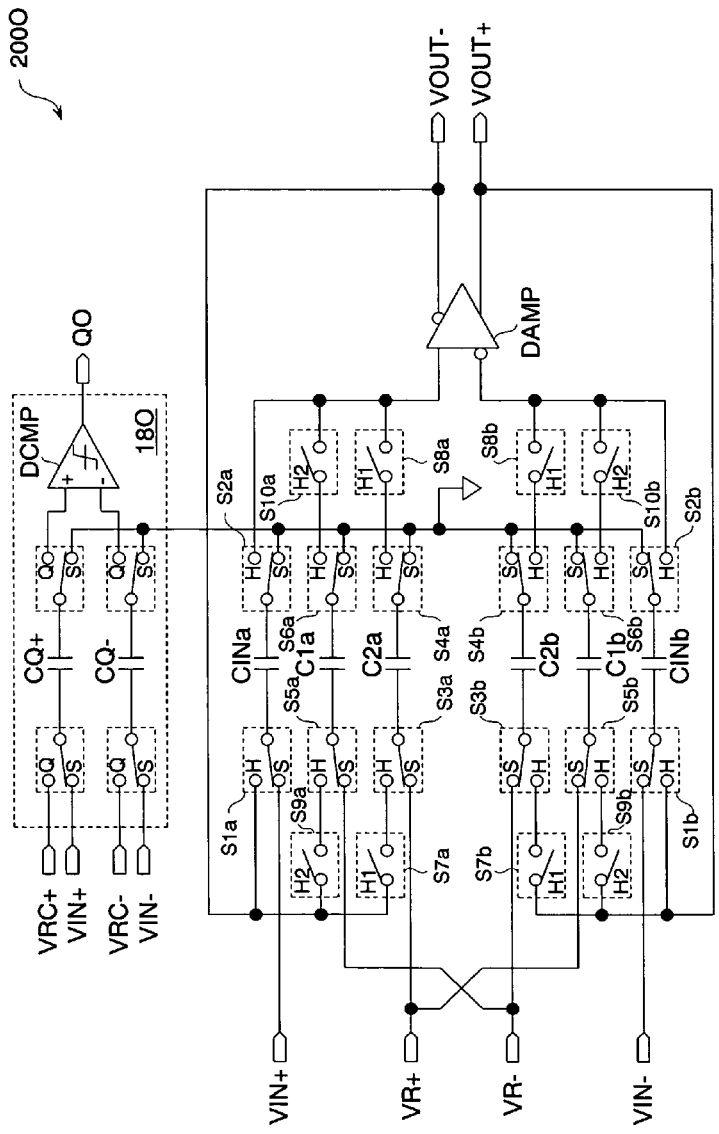
FIG. 28 is a circuit diagram showing another example of the switched-capacitor circuit.
Figure 29:
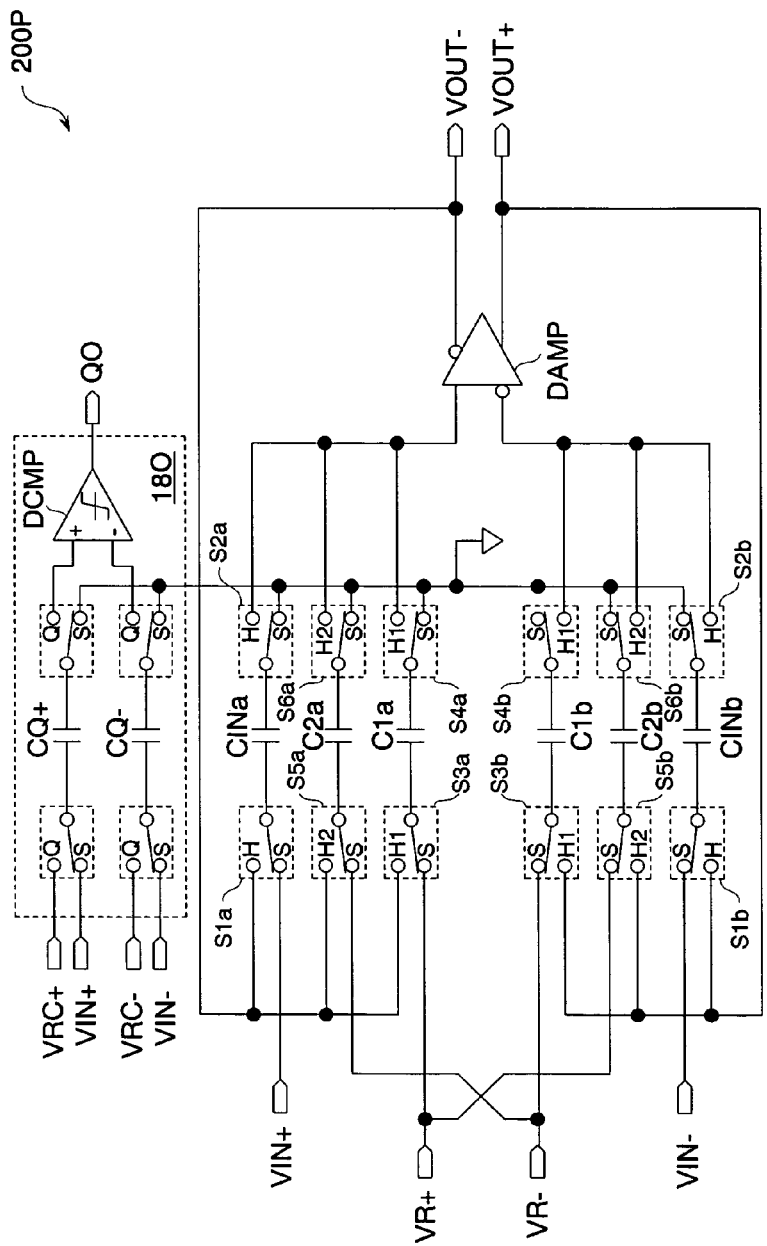
FIG. 29 is a circuit diagram showing another example of the switched-capacitor circuit.
Figure 30:
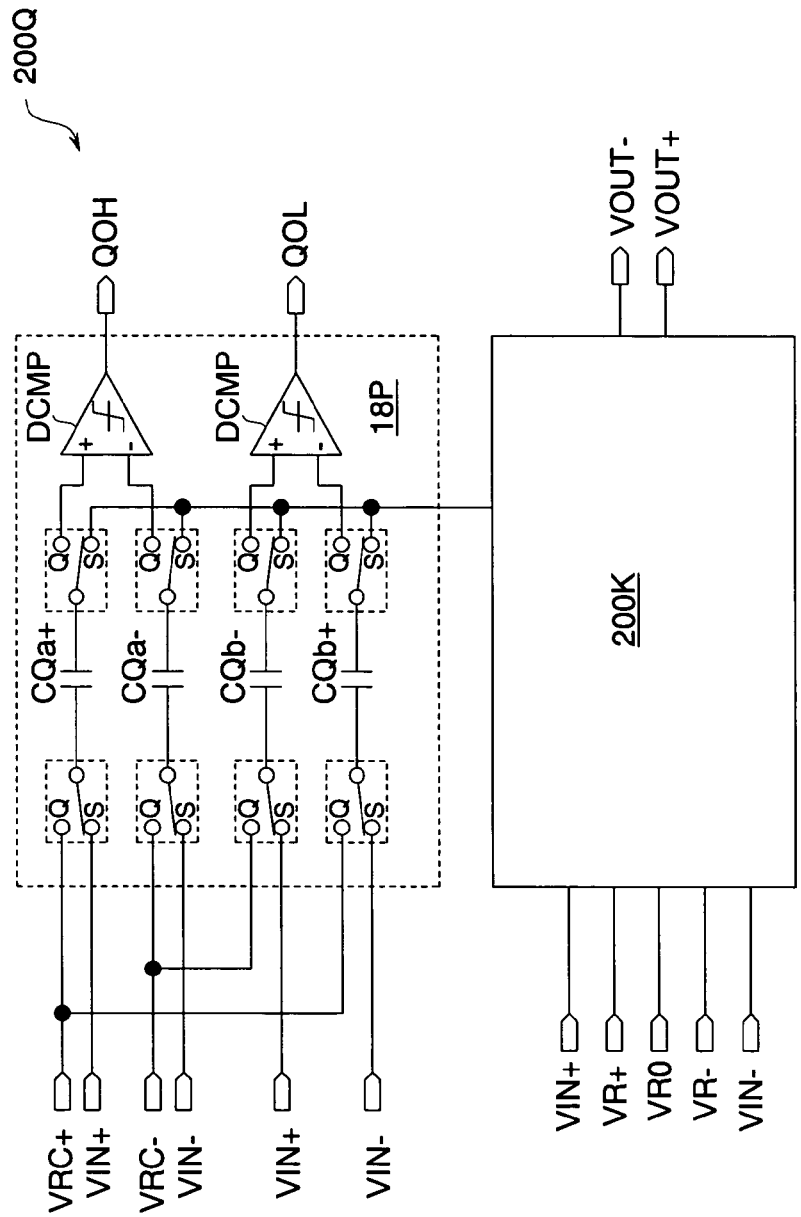
FIG. 30 is a circuit diagram showing another example of the switched-capacitor circuit.
Figure 31:
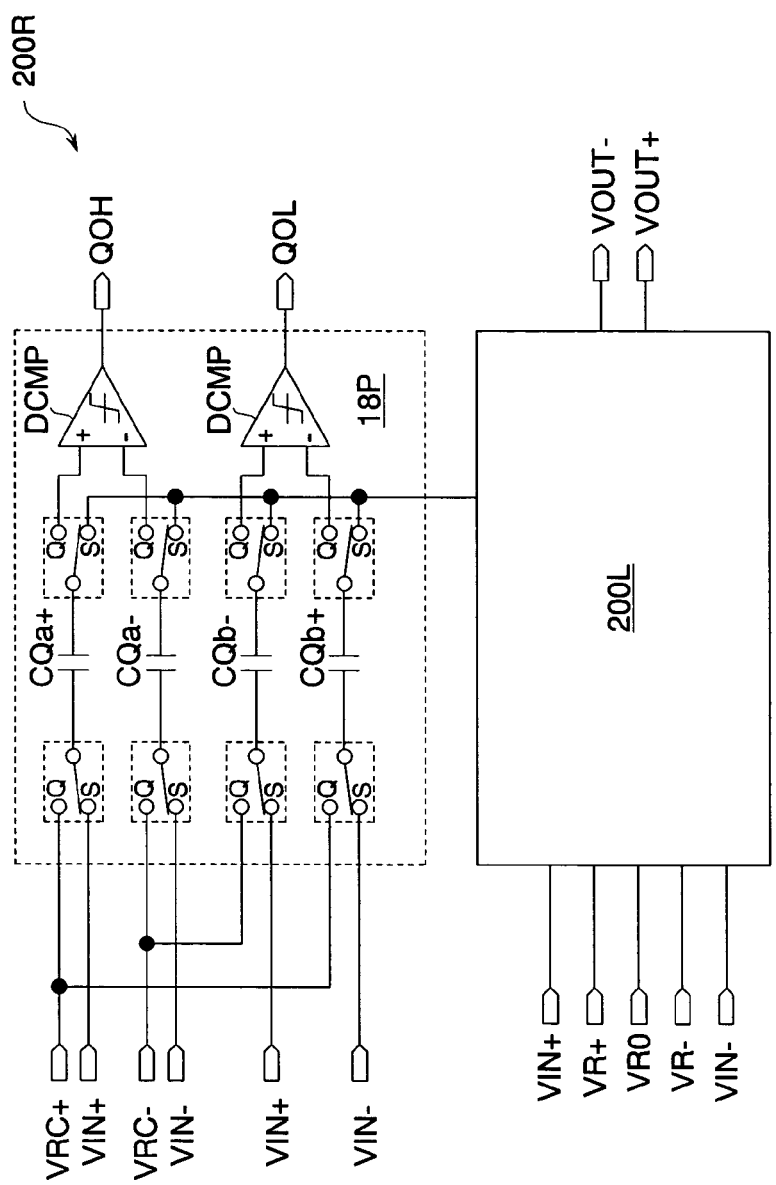
FIG. 31 is a circuit diagram showing another example of the switched-capacitor circuit.
Figure 32:
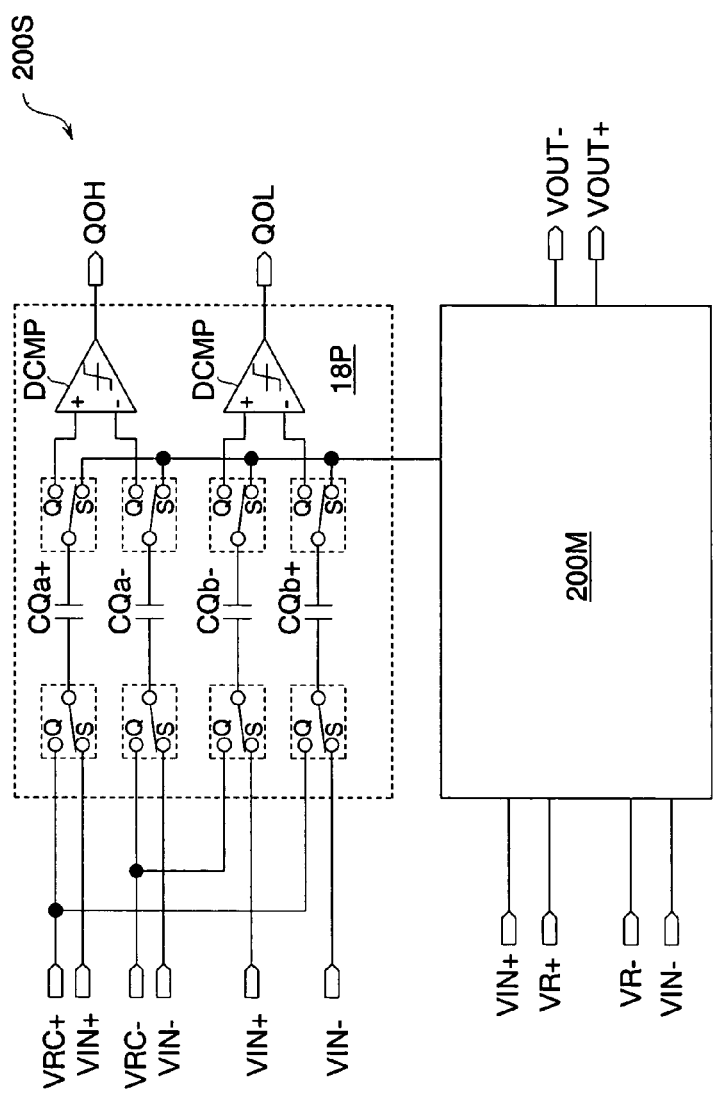
FIG. 32 is a circuit diagram showing another example of the switched-capacitor circuit.
Figure 33:
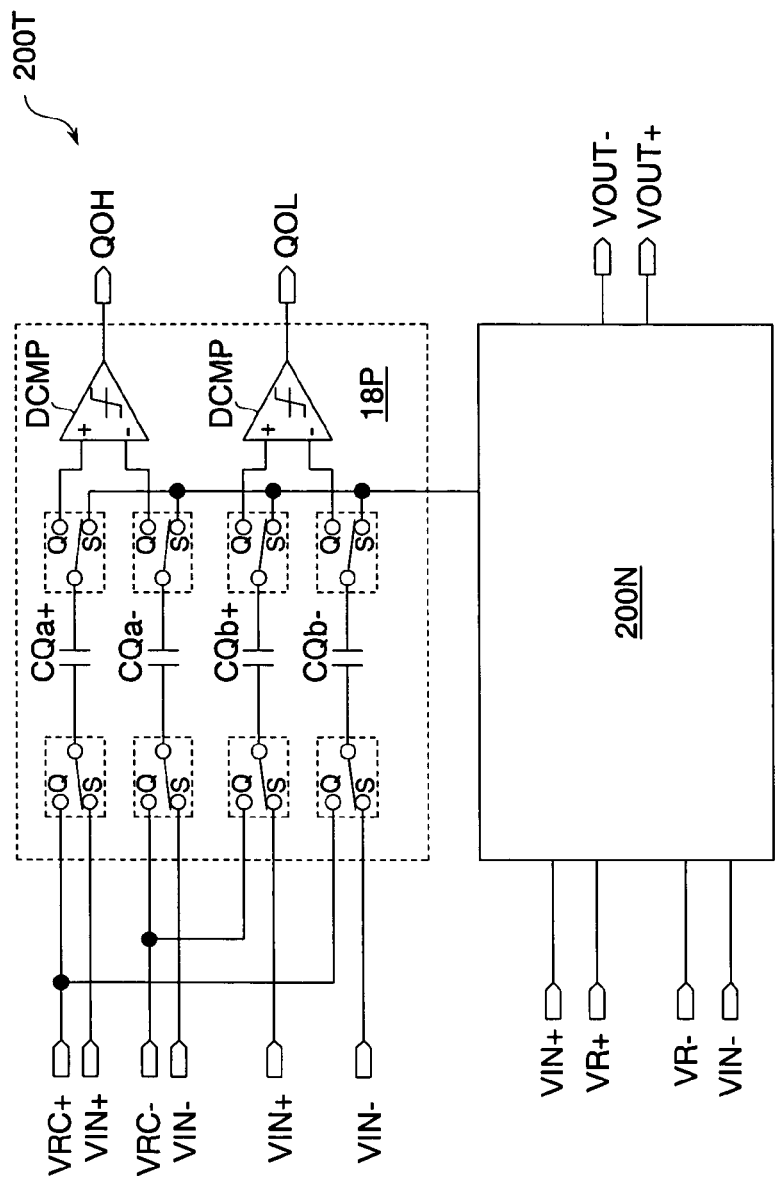
FIG. 33 is a circuit diagram showing another example of the switched-capacitor circuit.

The switched-capacitor circuit 200O in FIG. 28 is an example where the switched-capacitor circuit 200F of the seventh embodiment (FIG. 15) is changed to a complete differential type. The switched-capacitor circuit 200P in FIG. 29 is an example where part of the switches of the switched-capacitor circuit 200O in FIG. 28 are deleted in the same manner as in the second embodiment.

Figure 34:
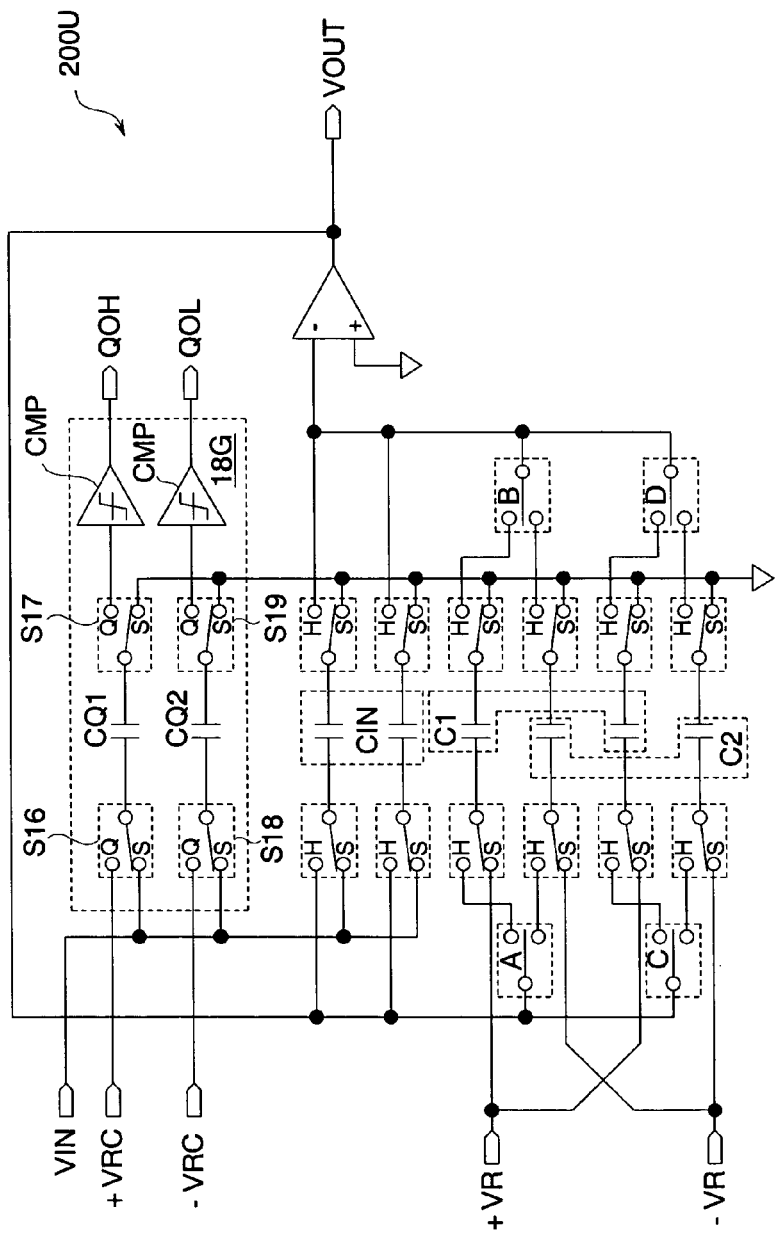
FIG. 34 is a circuit diagram showing another example of the switched-capacitor circuit.

The switched-capacitor circuits 200Q, 200R, 200S, 200T in FIG. 30 to FIG. 33 are examples where a comparing circuit 18P is added in the switched-capacitor circuits 200K, 200L, 200M, 200N. The switched-capacitor circuit 200U in FIG. 34 is an example where the comparing circuit 18G of the eighth embodiment (FIG. 18) is added in the switched-capacitor circuit 100E of the sixth embodiment (FIG. 14).

The invention is not limited to the above embodiments and various modifications may be made without departing from the spirit and scope of the invention. Any improvement may be made in part or all of the components.

What is claimed is:

1. A switched-capacitor circuit comprising:
    an input capacitor and first to n$^{th}$ reference capacitors (n is an integer equal to or larger than 2) sampling an input voltage and first to n$^{th}$ reference voltages, respectively, in a first period;
    an amplifier generating an output voltage corresponding to the input voltage in a second period subsequent to the first period; and
    a switch circuit that, in the second period, connects said input capacitor between an output and an input of said amplifier and connects at least one of said first to n$^{th}$ reference capacitors between the output and the input of said amplifier according to a control signal.

2. The switched-capacitor circuit according to claim 1, wherein
said switch circuit includes:
an input switch that connects both ends of said input capacitor to a node of the input voltage and a node of a fixed voltage in the first period and to the input and the output of said amplifier in the second period; and
a reference switch that connects both ends of each of said reference capacitors to a node of each of the reference voltages and a node of the fixed voltage in the first period and to the input and the output of said amplifier according to the control signal in the second period.

3. The switched-capacitor circuit according to claim 1, wherein
said switch circuit includes:
an input switch that connects one end of said input capacitor to a node of the input voltage in the first period and to the output of said amplifier in the second period;
a reference switch that connects both ends of each of said reference capacitors to a node of each of the reference voltages and the input of said amplifier in the first period and to the input and the output of said amplifier according to the control signal in the second period; and
a short switch that shorts the output and the input of said amplifier to each other in the first period.

4. The switched-capacitor circuit according to claim 1, wherein:
said amplifier is a differential amplifier having complementary inputs and complementary outputs; and
said input capacitor and said reference capacitors are formed for each pair of the input and the output of said amplifier.

5. The switched-capacitor circuit according to claim 1, wherein:
each of said first to $n^{th}$ reference capacitors is constituted of a plurality of sub-capacitors arranged in parallel; and
said switch circuit connects at least two of the sub-capacitors between the output and the input of said amplifier according to the control signal in the second period.

6. The switched-capacitor circuit according to claim 1, further comprising
a comparing circuit that compares magnitudes of the input voltage and a comparison voltage to output a comparison result as the control signal in a third period set between the first period and the second period.

7. The switched-capacitor circuit according to claim 6, wherein
said comparing circuit includes:
a comparison capacitor sampling the input voltage;
a comparator whose input is connected to one end of the comparison capacitor and which outputs the control signal from an output thereof; and
a comparing switch that connects both ends of the comparison capacitor to a node of the input voltage and a node of the fixed voltage in the first period and to a node of the comparison voltage and the input of the comparator in the third period.

8. A pipelined A/D converter comprising:
a plurality of stages connected in cascade, converting an analog voltage to a digital value in sequence from a higher-order digit, wherein:
at least one of said stages has a switched-capacitor circuit; and
the switched-capacitor circuit includes:
an input capacitor and first to $n^{th}$ reference capacitors (n is an integer equal to or larger than 2) sampling an input voltage and first to $n^{th}$ reference voltages, respectively, in a first period;
an amplifier generating an output voltage corresponding to the input voltage in a second period subsequent to the first period; and
a switch circuit that, in the second period, connects said input capacitor between an output and an input of said amplifier and connects at least one of said first to $n^{th}$ reference capacitors between the output and the input of said amplifier according to a control signal.

9. The pipelined A/D converter according to claim 8, further comprising
an encoding unit that encodes bit values respectively outputted from sub A/D converters formed in said stages, to output a digital value consisting of a plurality of bits.

10. The pipelined A/D converter according to claim 8, further comprising
a switch control circuit generating the control signal for turning on/off said switch circuit, wherein
each of said stages includes a sub A/D converter generating a bit value of the digital value; and
said switch control circuit generates the control signal according to the bit value outputted by the sub A/D converter connected to an input of said switched-capacitor circuit.

11. The pipelined A/D converter according to claim 8, wherein
said switch circuit includes:
an input switch that connects both ends of said input capacitor to a node of the input voltage and a node of a fixed voltage in the first period and to the input and the output of said amplifier in the second period; and
a reference switch that connects both ends of each of said reference capacitors to a node of each of the reference voltages and a node of the fixed voltage in the first period and to the input and the output of said amplifier according to the control signal in the second period.

12. The pipelined A/D converter according to claim 8, wherein
said switch circuit includes:
an input switch that connects one end of said input capacitor to a node of the input voltage in the first period and to the output of said amplifier in the second period;
a reference switch that connects both ends of each of said reference capacitors to a node of each of the reference voltages and the input of said amplifier in the first period and to the input and the output of said amplifier according to the control signal in the second period; and
a short switch that shorts the output and the input of said amplifier to each other in the first period.

13. The pipelined A/D converter according to claim 8, wherein:
said amplifier is a differential amplifier having complementary inputs and complementary outputs; and
said input capacitor and said reference capacitors are formed for each pair of the input and the output of said amplifier.

14. The pipelined A/D converter according to claim 8, wherein:
   each of said first to $n^{th}$ reference capacitors is constituted of a plurality of sub-capacitors arranged in parallel; and
   said switch circuit connects at least two of the sub-capacitors between the output and the input of said amplifier according to the control signal in the second period.

15. The pipelined A/D converter according to claim 8, further comprising
   a comparing circuit that compares magnitudes of the input voltage and a comparison voltage to output a comparison result as the control signal in a third period set between the first period and the second period.

16. The pipelined A/D converter according to claim 15, wherein said comparing circuit includes:
   a comparison capacitor sampling the input voltage;
   a comparator whose input is connected to one end of the comparison capacitor and which outputs the control signal from an output thereof; and
   a comparing switch that connects both ends of the comparison capacitor to a node of the input voltage and a node of the fixed voltage in the first period and to a node of the comparison voltage and the input of the comparator in the third period.

* * * * *